United States Patent
Choi et al.

(10) Patent No.: US 7,675,105 B2
(45) Date of Patent: Mar. 9, 2010

(54) NON-VOLATILE MEMORY DEVICE FOR 2-BIT OPERATION AND METHOD OF FABRICATING THE SAME

(75) Inventors: Byung-yong Choi, Suwon-si (KR); Dong-gun Park, Seongnam-si (KR); Yun-gi Kim, Yongin-si (KR); Choong-ho Lee, Seongnam-si (KR); Young-mi Lee, Suwon-si (KR); Hye-jin Cho, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 856 days.

(21) Appl. No.: 11/376,518

(22) Filed: Mar. 15, 2006

(65) Prior Publication Data

US 2006/0214219 A1      Sep. 28, 2006

(30) Foreign Application Priority Data

Mar. 22, 2005  (KR) .................. 10-2005-0023649

(51) Int. Cl.
*H01L 27/108* (2006.01)
*H01L 29/94* (2006.01)

(52) U.S. Cl. .................. 257/315; 257/E27.103
(58) Field of Classification Search .................. 257/315, 257/E27.103
See application file for complete search history.

(56) References Cited

U.S. PATENT DOCUMENTS

| | | | |
|---|---|---|---|
| 6,838,726 B1 * | 1/2005 | Forbes et al. | 257/321 |
| 2002/0175364 A1 * | 11/2002 | Ichige et al. | 257/314 |
| 2002/0191453 A1 * | 12/2002 | Owa | 365/200 |
| 2003/0198086 A1 * | 10/2003 | Shukuri | 365/185.18 |
| 2005/0202632 A1 * | 9/2005 | Ding | 438/257 |
| 2006/0006492 A1 * | 1/2006 | Shimizu | 257/506 |
| 2006/0068546 A1 * | 3/2006 | Chang | 438/257 |
| 2006/0068574 A1 * | 3/2006 | Lin et al. | 438/584 |
| 2006/0124988 A1 * | 6/2006 | Hur et al. | 257/315 |

FOREIGN PATENT DOCUMENTS

| | | |
|---|---|---|
| JP | 2003-258128 | 9/2003 |
| JP | 2004-047936 | 2/2004 |
| KR | 10-2004-0072342 | 8/2004 |

* cited by examiner

*Primary Examiner*—Kiesha R. Bryant
*Assistant Examiner*—Igwe U Anya
(74) *Attorney, Agent, or Firm*—Mills & Onello, LLP

(57) ABSTRACT

A non-volatile memory device for 2-bit operation and a method of fabricating the same are provided. The non-volatile memory device includes an active region and a gate extending in a word line direction on a semiconductor substrate, and crossing each other repeatedly; a charge storage layer disposed below the gate, and confined at a portion where the gate and the active region cross; a charge blocking layer formed on the charge storage layer; a tunnel dielectric layer formed below the charge storage layer; first and second source/drain regions formed in the active region exposed by the gate; and first and second bit lines crossing the word line direction. The active region may be formed in a first zigzag pattern and/or the gate may be formed in a second zigzag pattern in symmetry with the first zigzag pattern.

9 Claims, 36 Drawing Sheets

PR

NON-VOLATILE MEMORY DEVICE FOR 2-BIT OPERATION AND METHOD OF FABRICATING THE SAME

CROSS-REFERENCE TO RELATED PATENT APPLICATION

This application claims the benefit of Korean Patent Application No. 10-2005-0023649, filed on Mar. 22, 2005, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a non-volatile memory device including a memory cell array for 2-bit operation and a method of fabricating the same.

2. Description of the Related Art

A significant increase in memory density of non-volatile memory devices or flash memory devices is needed. Therefore, there have been efforts to reduce the size of the memory cell. There have also been introduced methods of increasing the memory density by increasing the number of states that can be stored in the memory cell. For example, a method of realizing 2-bit operation in one memory transistor structure is proposed.

FIG. 1 is a sectional view schematically illustrating a conventional non-volatile memory transistor device.

Referring to FIG. 1, a memory cell of the conventional non-volatile memory transistor device typically employs a transistor structure, which includes two source/drain regions 41, 45 in a semiconductor substrate 10, a channel 11 disposed in the substrate between the first source/drain region 41 and the second source/drain region 45, and a gate 30 formed on the channel 11. Further, a charge storage layer 20 may be interposed between the gate 30 and the semiconductor substrate 10.

It is reported that 2-bit operation is possible in the transistor structure as described above. For example, portions of the charge storage layer 20 respectively disposed close to the first and second source/drain regions 41, 45 are defined as local first and second charge storage regions 21, 23 respectively, or a storage node to realize 2-bit operation.

In order to realize 2-bit operation in such a transistor structure, first and second bit lines BL1, BL2 must be independently connected to the first and second source/drain regions 41, 45 respectively, and a word line WL must be connected to the gate 30. However, it has been understood that it is very difficult to realize an interconnection structure, in which three discrete terminals, that is, WL, BL1, BL2, are independently connected in one memory cell transistor as above.

In order to realize high integration of a memory device, several memory cells are connected to one word line WL, one bit line BL1, and one bit line BL2, and discrete memory cells must be aligned sufficiently to perform a write and/or a read operation independently. Since the bit lines BL1 and BL2 must be connected to one memory cell independently, the array of the word line WL, and the bit lines BL1 and BL2 must be considered very carefully.

If the gate 30 used for the word line WL extends along the direction that the active region extends, that is, the direction that the active region extends from the first source/drain region 41 to the second source/drain region 45, it is difficult that the bit lines BL1 and BL2 are directly connected to the first and second source/drain regions 41, 45 since the gate 30 and the charge storage layer 20 extend on the first and second source/drain regions 41, 45. Therefore, efforts have been made to design arrays of WL and BL1, BL2 for connecting memory cells for 2-bit operation.

For example, in order to realize the array structure, there has been proposed a structure extending in a direction where source/drain regions 41, 45 cross with WL, for example, a buried bit line structure. Further, there has been also proposed a structure in which a gate 30 does not extend to other neighboring memory cells and is cut, and an additional WL is connected to a discrete gate in each memory cell.

As shown in FIG. 1, if the gate 30 extends to a direction where an active region extends, that is, from a first source/drain region 41 to a second source/drain region 45, a charge storage layer 20 below the gate 30 extends together with the gate 30. In this case, the charge storage layer 20 necessarily extends to the isolation region for isolating memory cells.

The case considers convenience of processes, but may cause influences between signals of the storage charges between cells connected to one WL. Specifically, in the case that an integration density of a device for a highly-integrated memory device is increased, the mutual influence, for example, cross-talking phenomenon may be more serious. The stored charges, that is, interference between signals may function as a factor to limit the increase of integration degrees of a device. Thus, it is required to develop a process technology being capable of locally confining the charge storage layer 20.

SUMMARY OF THE INVENTION

The present invention provides a non-volatile memory device including arrays of a word line, a first bit line, a second bit line, and an active region to operate non-volatile memory cells for 2-bit operation, and a method of fabricating the same.

According to a first aspect, the invention is directed to a non-volatile memory device for 2-bit operation comprising: an active region and a gate extending in a word line direction on a semiconductor substrate, and crossing each other repeatedly; a charge storage layer disposed below the gate, and confined at a portion where the gate and the active region cross; a charge blocking layer formed at an interface between the charge storage layer and the gate; a tunnel dielectric layer formed at an interface between the charge storage layer and the active region; first and second source/drain regions formed at an exposed portion out of both sides of the gate in the active region; and first and second bit lines connected to the first and second source/drain regions respectively, and formed to extend in a bit line direction crossing the word line direction.

According to another aspect, the invention is directed to a non-volatile memory device for 2-bit operation comprising: active regions formed in a first zigzag pattern to extend in a word line direction in a semiconductor substrate, and partially to be bent repeatedly; gates formed in a second zigzag pattern to extend in a word line direction in the semiconductor substrate, partially to cross with the active regions, and to be bent repeatedly in symmetry with the first zigzag pattern; a charge storage layer disposed below the gate, and confined at a portion where the gate and the active regions cross; a charge blocking layer formed at an interface between the charge storage layer and the gate; a tunnel dielectric layer formed at an interface between the charge storage layer and the active regions; first and second source/drain regions formed at an exposed portion out of both sides of the gate in the active regions; and first and second bit lines connected to the first and second source/drain regions respectively, and formed to extend in a bit line direction crossing the word line direction.

According to another aspect, the invention is directed to a non-volatile memory device for 2-bit operation comprising: active regions formed in a zigzag pattern and formed to extend in a word line direction in a semiconductor substrate and partially to be bent repeatedly; gates formed in a straight pattern and formed to extend in a word line direction on the semiconductor substrate and partially to cross the active regions repeatedly; a charge storage layer disposed below the gate, and confined at a portion where the gate and the active regions cross; a charge blocking layer formed at an interface between the charge storage layer and the gate; a tunnel dielectric layer formed at an interface between the charge storage layer and the active regions; first and second source/drain regions formed at an exposed portion out of both sides of the gate in the active regions; and first and second bit lines connected to the first and second source/drain regions respectively, and formed to extend in a bit line direction crossing the word line direction.

According to another aspect, the invention is directed to a non-volatile memory device for 2-bit operation comprising: active regions formed in a straight pattern and formed to extend in a word line direction in a semiconductor substrate; gates formed in a zigzag pattern and formed to extend in a word line direction on the semiconductor substrate and partially to cross the active regions repeatedly, and to be bent repeatedly; a charge storage layer disposed below the gate, and confined at a portion where the gate and the active regions cross; a charge blocking layer formed at an interface between the charge storage layer and the gate; a tunnel dielectric layer formed at an interface between the charge storage layer and the active regions; first and second source/drain regions formed at an exposed portion out of both sides of the gate in the active regions; and first and second bit lines connected to the first and second source/drain regions respectively, and formed to extend in a bit line direction crossing the word line direction.

According to another aspect, the invention is directed to a method of fabricating a non-volatile memory for 2-bit operation comprising: sequentially forming a tunnel dielectric layer, a charge storage layer, and a charge blocking layer on a semiconductor substrate; forming a hard mask for an isolation region defining active regions with a first zigzag pattern extending in a word line direction on the charge blocking layer, and partially being bent repeatedly; sequentially patterning the tunnel dielectric layer, the charge storage layer, and the charge blocking layer, using the hard mask as an etch mask; forming the isolation region in the semiconductor substrate exposed to the hard mask; selectively removing the hard mask; forming gates in a second zigzag pattern on the patterned charge blocking layer to extend in a word line direction on the semiconductor substrate, and partially to cross with the active regions repeatedly and repeatedly to be bent in symmetry with the first zigzag pattern; selectively removing the underneath exposed and remaining charge blocking layer, the charge storage layer and the tunnel dielectric layer using the gate as an etch mask, thereby patterning such that the charge storage layer is confined to the portions where the gate and the active cross; forming first and second source/drain regions in the active region at a region exposed out of both sides of the gate; forming an insulating layer to cover the first and second source/drain regions and the gate; forming a connecting contact penetrating the insulating layer and exposing the first and second source/drain regions; and forming first and second bit lines on the insulating layer to be connected to the first and second source/drain regions respectively through the connecting contact and extend in a bit line direction crossing the word line direction.

According to another aspect, the invention is directed to a method of fabricating a non-volatile memory device for 2-bit operation comprising: sequentially forming a tunnel dielectric layer, a charge storage layer, and a charge blocking layer on a semiconductor substrate; forming a hard mask for an isolation region defining active regions defined as a zigzag pattern extending in a word line direction on the charge blocking layer and partially being bent repeatedly; sequentially patterning the tunnel dielectric layer, the charge storage layer, and the charge blocking layer using the hard mask as an etch mask; forming the isolation region on the semiconductor substrate portion exposed to the hard mask; selectively removing the hard mask; forming gates of a straight pattern extending in a word line direction on the patterned charge blocking layer and partially crossing with the active regions repeatedly; selectively removing the underneath remaining charge blocking layer, the charge storage layer, and the tunnel dielectric layer portion using the gate as an etch mask, thereby patterning to confine the charge storage layer at a portion where the gate and the active regions cross; forming first and second source/drain regions at a portion exposed out of both sides of the gate in the active; forming an insulating layer covering the first and second source/drain regions and the gate; forming a connecting contact penetrating the insulating layer and exposing the first and second source/drain regions; and forming first and second bit lines on the insulating layer to be connected to the first and second source/drain regions respectively through the connecting contact and extend in a bit line direction crossing with the word line direction.

According to another aspect, the invention is directed to a method of fabricating a non-volatile memory device for 2-bit operation comprising: sequentially forming a tunnel dielectric layer, a charge storage layer, and a charge blocking layer on a semiconductor substrate; forming a hard mask for an isolation region defining active regions defined as a straight pattern extending in a word line direction on the charge blocking layer; sequentially patterning the tunnel dielectric layer, the charge storage layer, and the charge blocking layer using the hard mask as an etch mask; forming the isolation region on the semiconductor substrate portion exposed to the hard mask; selectively removing the hard mask; forming gates of a zigzag pattern extending in a word line direction on the patterned charge blocking layer, partially crossing with the active regions repeatedly, and partially being bent repeatedly; selectively removing the underneath remaining charge blocking layer, the charge storage layer, and the tunnel dielectric layer portion using the gate as an etch mask, thereby patterning to confine the charge storage layer at a portion where the gate and the active regions cross; forming first and second source/drain regions at a portion exposed out of both sides of the gate in the active regions; forming an insulating layer covering the first and second source/drain regions and the gate; forming a connecting contact penetrating the insulating layer and exposing the first and second source/drain regions; and forming first and second bit lines on the insulating layer to be connected to the first and second source/drain regions respectively through the connecting contact and extend in a bit line direction crossing with the word line direction.

The active region may be formed in a zigzag pattern to extend in the word line direction in the semiconductor substrate and partially to be bent repeatedly, and the gate may be formed in a straight pattern to extend in the word line direction on the semiconductor substrate, and partially cross with the active region repeatedly.

Alternatively, the active region may be formed in a straight pattern to extend in the word line direction in the semiconductor substrate, and the gate may be formed in a zigzag pattern to extend in the word line direction on the semiconductor substrate, partially cross with the active region repeatedly, and to be bent repeatedly.

The charge storage layer may be formed as a pair separated below the gate adjacent to the first and second source/drain regions adjacent to both sides of the gate, and the gate extends to the active portion between separated two charge storage layers. The non-volatile memory device may further comprise a gate dielectric layer formed at an interface between the gate portion extending between the two charge storage layers and the active portion.

The charge blocking layer may extend to an interface between the gate portion extending between the two charge storage layers to cover sidewalls of the charge storage layer and form the gate dielectric layer and the active portion.

The charge storage layer may be formed as a pair separated below the gate adjacent to the first and second source/drain regions adjacent to both sides of the gate.

The gate may further include a first gate formed on the active portion between separated two charge storage layers; second gates aligned to the charge storage layers on the two charge storage layers respectively, and attached to sides of the first gate; and a gate dielectric layer formed at an interface between the first gate portion and the active portion.

The gate dielectric layer may cover sides of the two charge storage layers and may extend to an interface between the first gate and the second gate.

The charge storage layer may include a silicon nitride layer, a polysilicon layer, a layer of silicon dots, a silicon germanium layer, or nano crystal for charge storages.

The non-volatile memory device may further include an insulating spacer attached to sides of the gate, and a connecting contact in an SAC shape connecting the first and second bit lines and the first and second source/drain regions respectively.

The non-volatile memory device may further include first pads connected to ends of the gates, and electrically connecting the word lines aligned together to outside; and second pads aligned separated from the alignment of the first pads, and electrically connecting the bit lines to outside.

Forming a gate may include forming a sacrificial layer on the charge blocking layer as a mold following a shape of the gate and having an opening having a smaller line width than that of the gate; selectively removing the exposed charge blocking layer, the charge storage layer, and the tunnel dielectric layer using the sacrificial layer as an etch mask, thereby exposing the underneath active portion and the isolation region portion; forming a gate dielectric layer on the exposed active portion to extend to sidewalls of the sacrificial layer; forming a first gate on the gate dielectric layer to fill the opening; selectively removing the sacrificial layer pattern; and forming a second gate in a spacer shape attached to sidewalls of the first gate, thereby forming the gate.

Alternatively, forming a gate may include forming a sacrificial layer on the charge blocking layer as a mold following a shape of the gate and having an opening with a line width equal to that of the gate; attaching a sacrificial spacer on sidewalls of the opening; selectively removing the exposed charge blocking layer, the charge storage layer, and the tunnel dielectric layer portion, using the sacrificial layer and the sacrificial spacer as etch masks, thereby exposing the underneath active portion and the isolation region portion; selectively removing the sacrificial spacer; selectively removing the remained charge blocking layer portion exposed to the sacrificial layer, thereby exposing the underneath remained charge storage layer portion; forming a gate dielectric layer on the exposed active portion to cover the exposed charge storage layer portion and extend to sidewalls of the sacrificial layer; forming a gate on the gate dielectric layer to fill the opening; and selectively removing the sacrificial layer pattern.

The gate may be formed to include a conductive polysilicon layer, a silicide layer, or a metal layer.

According to the present invention, there are provided a non-volatile memory device including arrays of a word line, a first bit line, a second bit line, and an active region to operate non-volatile memory cells for 2-bit operation, and a method of fabricating the same.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
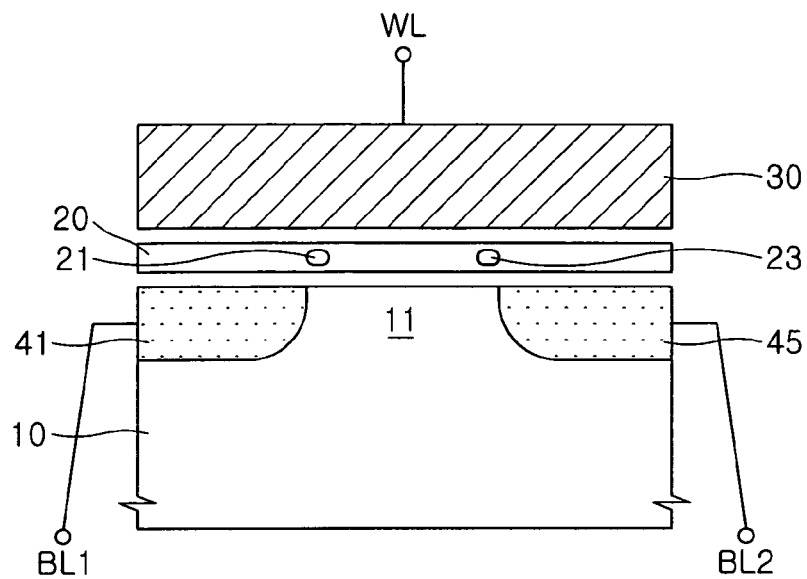
FIG. 1 is a sectional view schematically illustrating a conventional non-volatile memory transistor device.

The present invention will now be described more fully hereinafter with reference to the accompanying drawings, in which preferred embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

In embodiments of the present invention, a memory cell array is provided, in which a word line WL, a first bit line BL1 and a second bit line BL2 are independently connected to a non-volatile memory cell for 2-bit operation. Each memory cell is structured to include one transistor, and the transistor may be formed to include a gate, first and second source/drain regions, and local charge storage layers.

The first and second source/drain regions are disposed opposite to each other below the gate with a channel between them, and the local charge storage layers are separated from each other, below the gate adjacent to the first and second source/drain regions, respectively.

Continuously-aligned plural memory cells which are arrayed in the same direction as regions in the semiconductor substrate to form a transistor structure, for example, active regions extend are formed to be connected to one WL, and plural WLs are aligned in parallel with the one WL. The active region may be formed in a direction in which the WL runs, that is, extending in a WL direction, and some portions of the active region are formed to be exposed out of the WL such that the WL and the active region partially overlap.

For example, either one of the word line WL and the active region may be formed with a zigzag pattern. Thus, the word line is partially in across with the active region, and the crossed regions are repeatedly formed along the direction that the active region extends, that is, the WL direction, with bent portions of the zigzag pattern repeated. One memory cell is formed in the crossed region. Further, connecting contacts for the connection of memory cells with the two bit lines BL1, BL2 are connected to portions of an active region exposed to a region where the WL and the active region cross.

The WL and the active region may be all formed in zigzag pattern, and in this case, the first zigzag pattern of the active region and the second zigzag pattern for the WL may overlap such that portions of the active region in the region where the WL and the active region cross repeatedly, or between crossed regions, are not partially hidden and exposed beside the WL.

For example, a first zigzag pattern of the active region may be a zigzag pattern bent in a right handed direction, and the WL may be a zigzag pattern bent in a left handed direction. That is, the first and second zigzag pattern may be substantially in symmetry with each other. If the first and second zigzag patterns are disposed to overlap in plane, the first and second zigzag patterns are formed such that the partially crossed portion and the portion underneath the first zigzag pattern is exposed without crossed are repeatedly disposed.

The BL1 and BL2 may be formed to cross with the WL. The BL1 and BL2 are connected to one memory cell, and a plurality of memory cells are repeatedly disposed to cross with one WL repeatedly. The BL1 and BL2 are respectively connected to the active region exposed to both sides of the WL through the connecting contact. Thus, connection contacts are respectively formed to the active regions exposed to both sides where the active region and the WL cross with each other, and BL1 and BL2 are connected to the connecting contacts respectively.

A physically separated local charge storage layer is formed at a cross point where the first zigzag pattern of the active region and the second zigzag pattern of the WL are crossed. The charge storage layers are formed symmetrically below the WL adjacent to both sides of the WL, preferably, two charge storage layers are formed in one memory cell. Since the charge storage layers are formed physically separated, they can be regarded as one locally separated charge node. Thus, when considering one memory cell, two charge storage layers are formed respectively in relation with discrete bit lines BL1, BL2.

The charge storage layers are formed only inside the region where the active regions overlap. Thus, the charge storage layer does not extend over the isolation region determining the active region. Thus, a cross talking phenomenon between the cells can be effectively suppressed. Thus, since the limitation of the device integration due to the cross talking phenomenon can be eliminated, the integration of the devices can be further increased.

FIGS. 2 through 7 are plan views schematically illustrating a cell array of a non-volatile memory device for 2-bit operation according to a first embodiment of the present invention.

Figure 2:
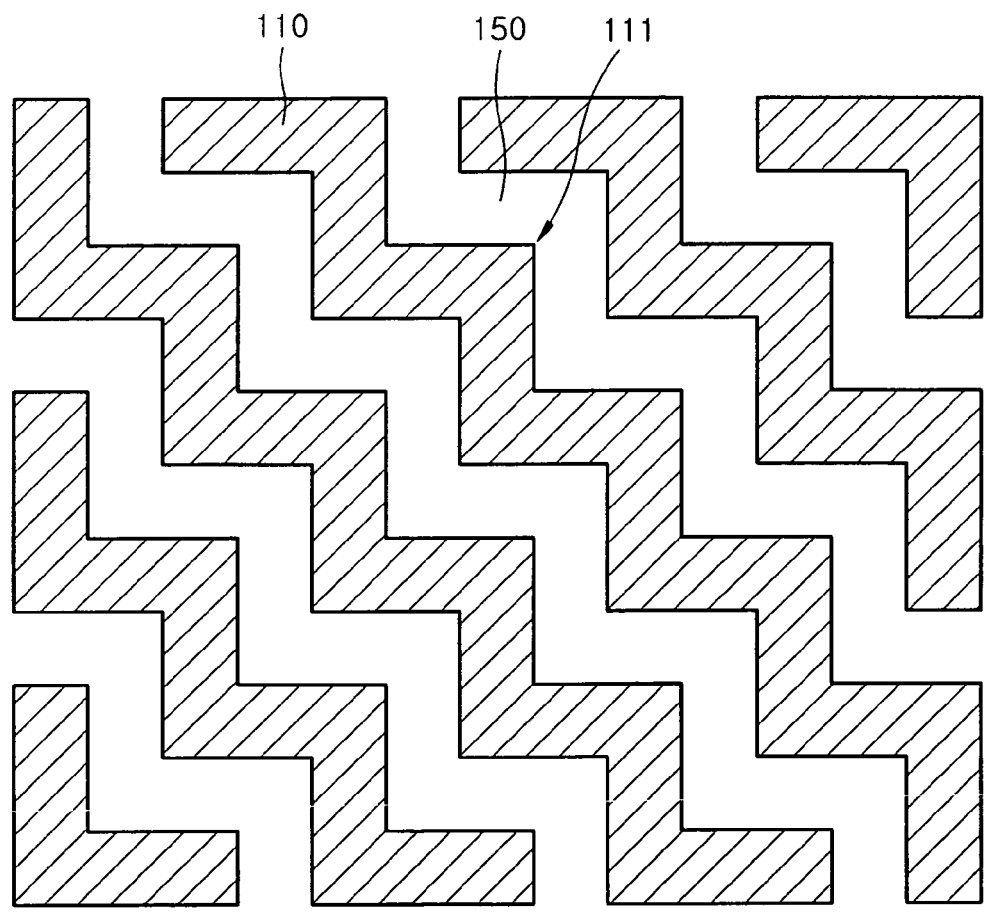
FIGS. 2 through 7 are plan views schematically illustrating a cell array of a non-volatile memory device for 2-bit operation according to a first embodiment of the present invention.

Referring to FIG. 2, the non-volatile memory device according to a first embodiment of the present invention may include an active region 110 formed in a first zigzag pattern shape. The active region 110, which is defined by an isolation region 150, has a line shape extending along a predetermined direction, for example, a WL direction as shown in FIG. 2, and has bending portions 111 bent in the line at a predetermined interval so as to constitute a first zigzag pattern shape. The isolation region 150 may include an insulating layer formed by a shallow trench isolation (STI) method. Alternatively, the isolation region 150 may be formed using a local oxidation of silicon (LOCOS) process.

Figure 3:
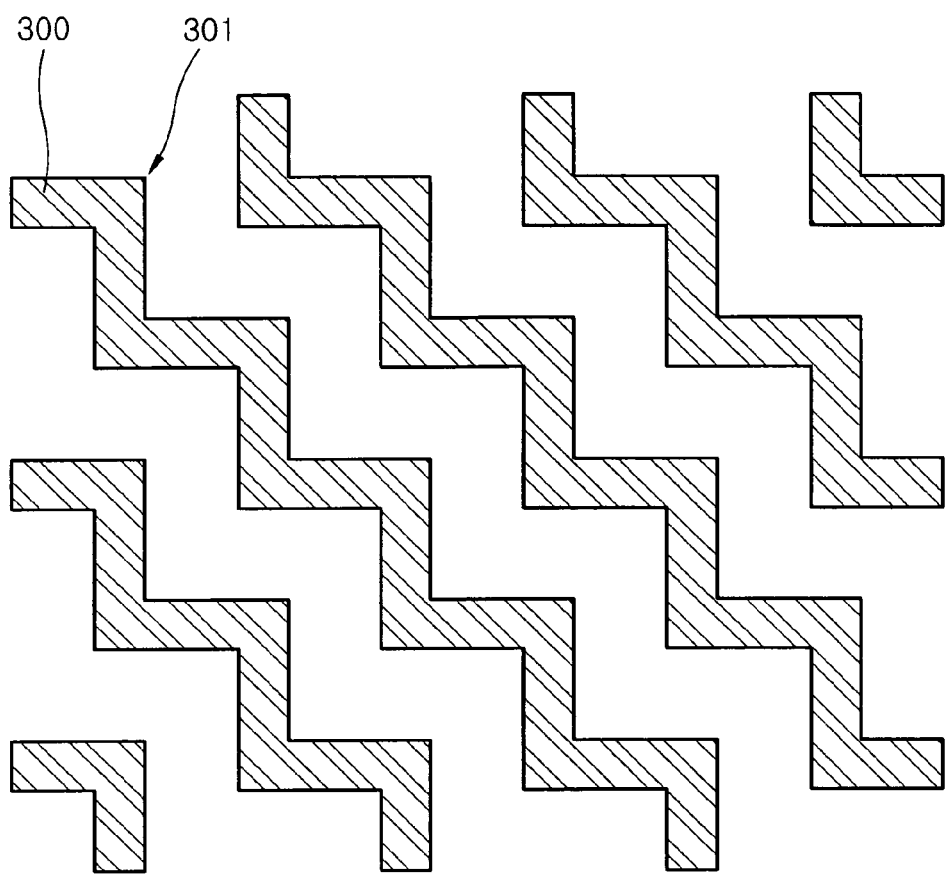

Referring to FIG. 3, the non-volatile memory device according to a first embodiment of the present invention may include a gate pattern as a WL 300 formed in a second zigzag pattern corresponding to the first zigzag pattern. The gate pattern, that is, the WL 300, has a line shape extending along a predetermined direction, for example, a WL direction as shown in FIG. 3, and has bending portions 301 bent in the line at a predetermined interval so as to constitute the second zigzag pattern.

At this time, the second zigzag pattern of the WL 300 may be formed as a zigzag pattern symmetric to the first zigzag pattern of the active region 110 (FIG. 2). For example, if the first zigzag pattern of the active region 110 is a zigzag pattern bent in a right handed direction, the second zigzag pattern of the WL 300 may be a zigzag pattern bent in a left handed direction symmetric to the first zigzag pattern.

Figure 4:
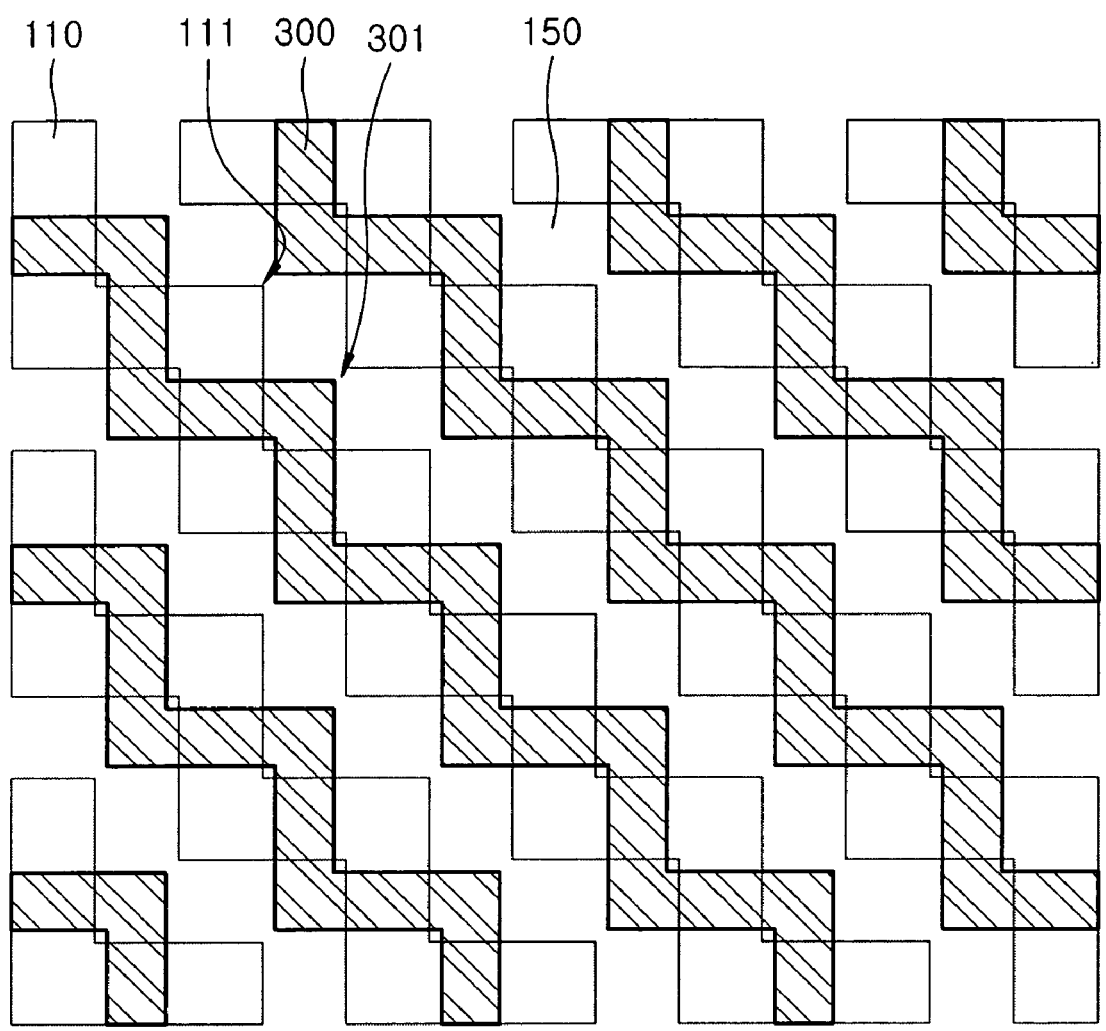

Referring to FIG. 4, the non-volatile memory device according to a first embodiment of the present invention may be configured with an array, in which the second zigzag pattern of the WL 300 overlaps the first zigzag pattern of the active region 110. In this configuration, the second zigzag pattern of the WL 300 is configured to partially cross with the active region 110 of the first zigzag pattern, and crossing portions are repeatedly provided along a word line direction.

Since the second zigzag pattern of the WL 300 and the first zigzag pattern of the active region 110 are formed in symmetry with each other, the crossing portions and portions of the active region 110 exposed out of both side ends of the WL 300 and not crossing with the WL 300 are repeatedly provided along a word line direction. At this time, the second zigzag pattern of the WL 300 and the first zigzag pattern of the active region 110 can be formed to cross with each other as shown in FIG. 4 such that the crossing portions between the second zigzag pattern of the WL 300 and the first zigzag pattern of the active region 110 can be preferably separated.

Figure 5:
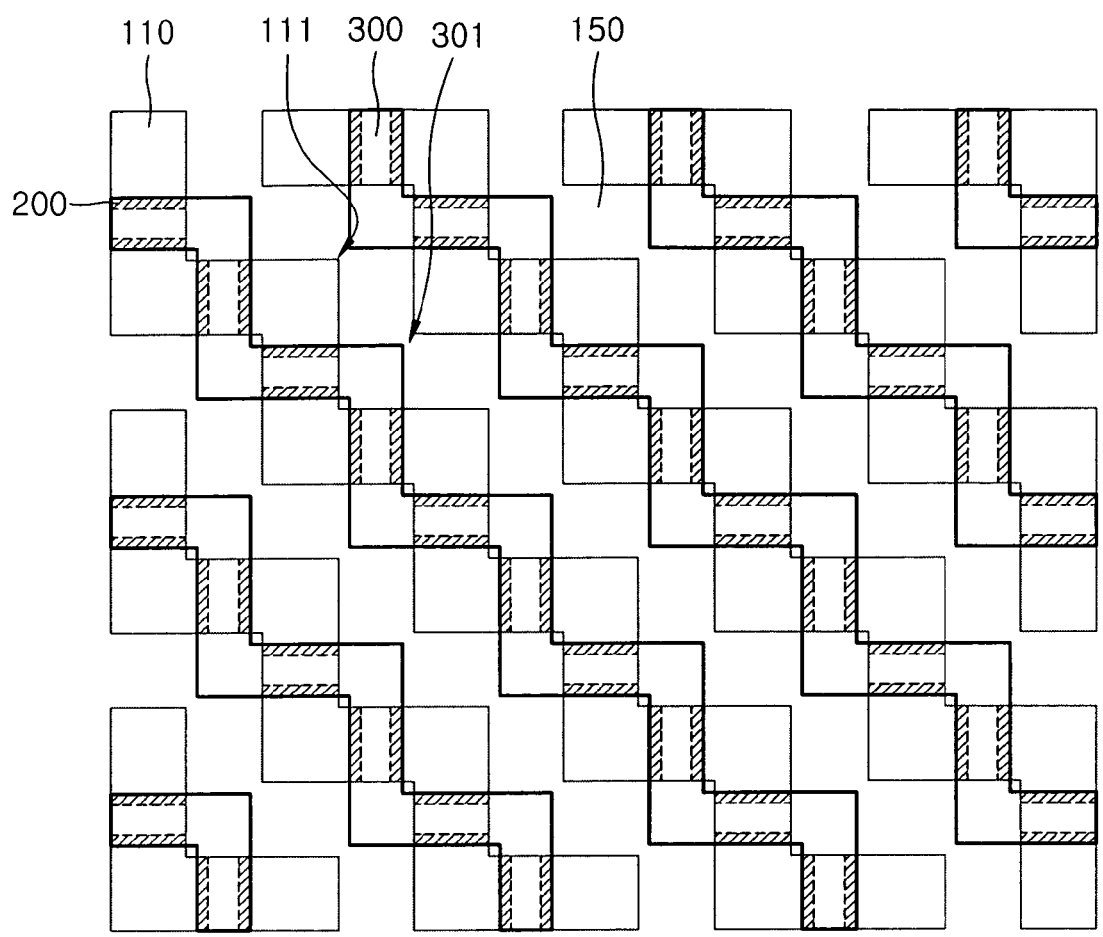

Referring to FIG. 5, the non-volatile memory device according to a first embodiment of the present invention may include charge storage nodes or charge storage layers 200, which are locally disposed only in each of the crossing portions of the active region 110 of the first zigzag pattern and the WL 300 of the second zigzag pattern, separated from each other.

The non-volatile memory device, for example, a silicon-oxide-nitride-oxide-silicon (SONOS) device, has the charge storage layer 200 as a node for capturing and storing charges disposed at an interface between the WL 300 and the active region 110. The charges captured in the charge storage layer 200 are used to change a threshold voltage $V_{th}$ of the active region 110 below the WL 300, that is, a channel, and to change a memory state of the transistor.

In the first embodiment of the present invention, the charge storage layer 200 is locally formed only in a portion where the WL 300 and the active region 110 cross. Thus, the charge storage layer 200 is not formed to extend below the WL 300 extending on an isolation region 150 crossing the active region 110 and disposed adjacent to the active region 110.

Therefore, it can effectively suppress a crosstalking phenomenon between the cells, which may occur when the charge storage layer extends on the isolation region. Therefore, the limitation of device integration due to the crosstalking phenomenon can be eliminated, thereby further increasing the integration of a device.

Two charge storage layers 200 are preferably disposed below the WL 300 adjacent to both side ends of the WL 300 crossing the active region 110, in opposite to each other as shown in FIG. 5.

Figure 6:
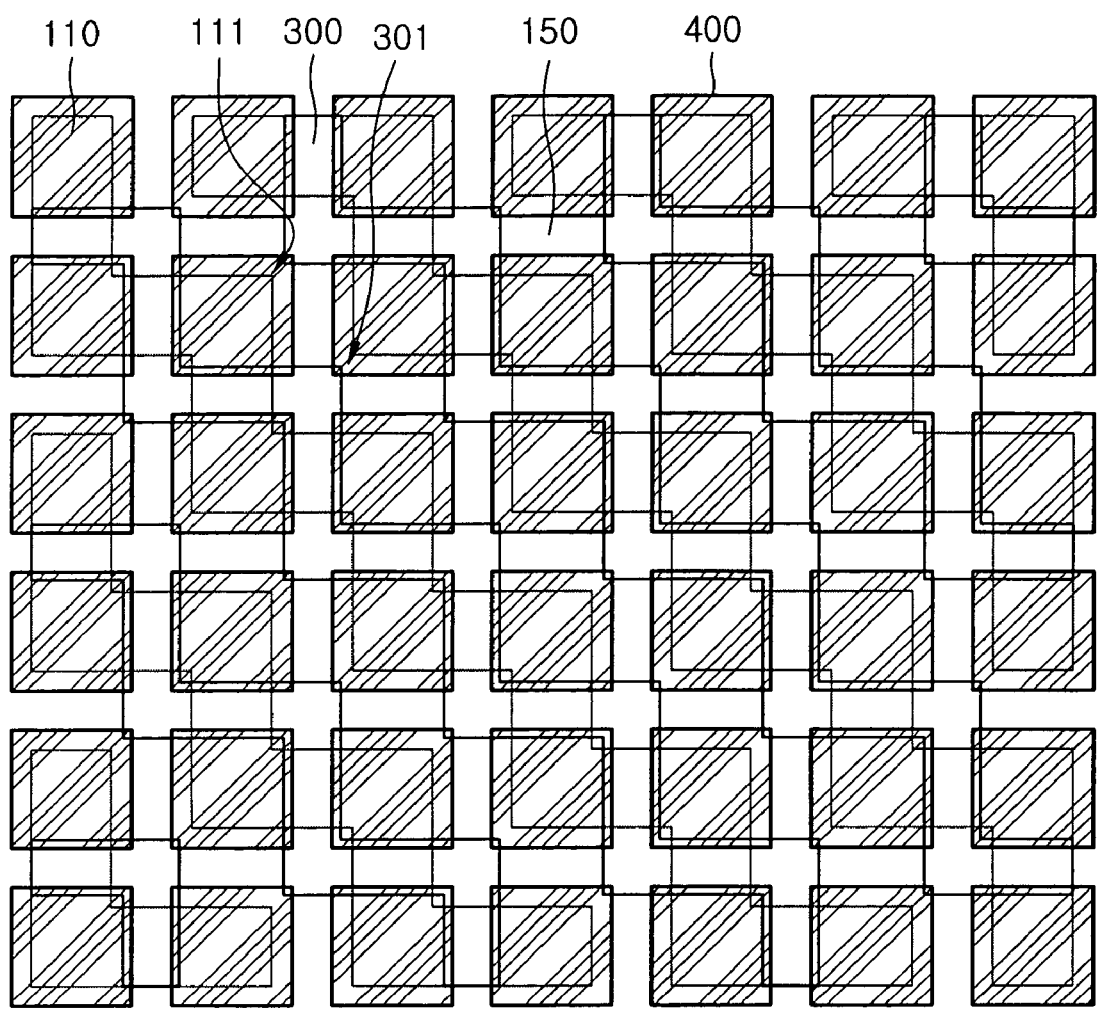

Referring to FIG. 6, the non-volatile memory device according to a first embodiment of the present invention may be structured to include a bit line connecting contact 400, which contacts the portion exposed at both side ends of the WL 300 of the active region 110. A portion to cross with the WL 300 of the active region 110 is substantially used as a channel of the transistor of the memory cell, and portions exposed out of both side ends of the WL 300 of the active region 110 are substantially used as portions where source/drain regions of the transistor will be formed.

For 2-bit operation in the transistor, bit lines BL are electrically connected to two source/drain regions of the transistor, respectively. The connecting contacts 400 of FIG. 6 are provided to electrically connect the source/drain regions of the transistor to the bit lines BL, respectively. Thus, the connecting contact 400 is formed to include portions exposed out of both side ends of the WL 300 of the active region 110.

The connecting contact 400 may be formed as a self-aligned contact (SAC). That is, an insulation spacer is formed on the sides of the WL 300, and the connecting contact 400 may be formed as an SAC to prevent the sides of the WL 300 from being exposed to a contact hole for connecting contact by the insulation spacer.

Figure 7:
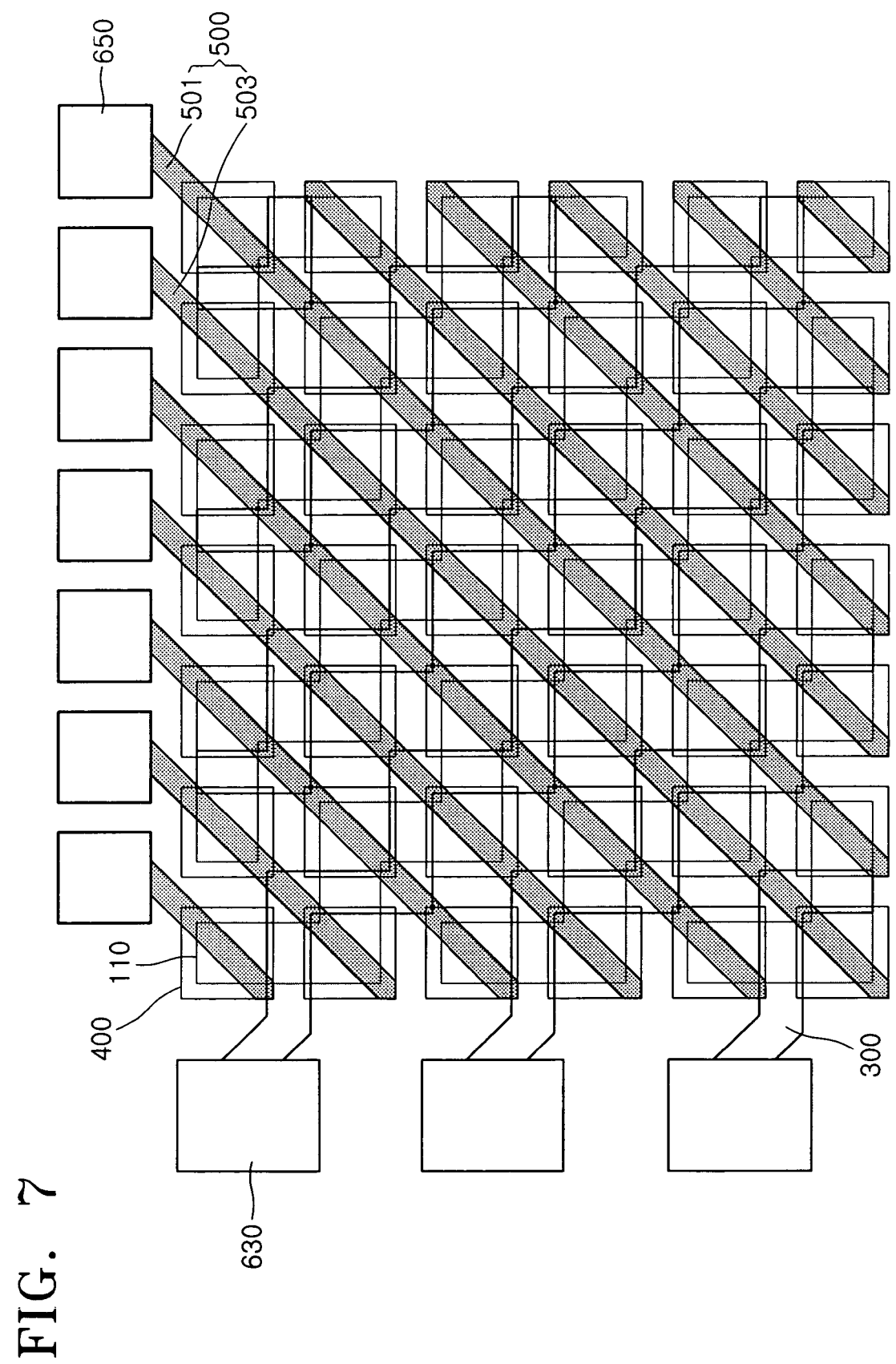

Referring to FIG. 7, the non-volatile memory device according to a first embodiment of the present invention may be structured to include bit lines 500 formed to cross with the WL 300. The bit lines 500 are formed such that two bit lines, for example, first and second bit lines BL1, BL2, 501, 503 are connected to one memory cell. The bit lines 500 may be formed in a line shape extending along a predetermined direction, for example, a BL direction crossing with the WL direction.

With the WL 300 and the BL 500 aligned to cross with each other, word line pads 630 for the WL 300 and bit line pads 650 for the BL 500 may be respectively aligned in different sides of the cell region where memory cells are aligned. For example, the word line pads 630 are aligned in the region adjacent to a first side of the cell region, preferably rectangular shape, and the bit line pads 650 are aligned in the region adjacent to a second side of the cell region perpendicular to the alignment of the word line pads 630.

As such, since the cell alignment is made such that the WL 300 and the BL 500 cross with each other, the WL 300 and the BL 500 may be aligned in a matrix shape. Thus, specific memory cells among the repeatedly-aligned memory cells in a matrix shape can be selected by the selection of specific WL 300 and the selection of specific BL1 501 and/or BL2 503. Thus, the word line pads 630 and the bit line pads 650 may be aligned in different regions separated from each other as shown in FIG. 7. Thus, since the alignment of the pads 630, 650 in a core region and/or a peripheral region adjacent to the cell region may be significantly simplified, complicated problems in the core region and/or the peripheral region may not occur.

As such, a memory cell transistor is formed with the cell alignment of the non-volatile memory device according to a first embodiment of the present invention maintained.

FIGS. 8 through 17 are sectional views schematically illustrating a non-volatile memory device for 2-bit operation and a method of fabricating the same according to a second embodiment of the present invention. FIGS. 18 through 24 are plan views schematically illustrating a non-volatile memory device for 2-bit operation and a method of fabricating the same according to the second embodiment of the present invention.

Figure 8:
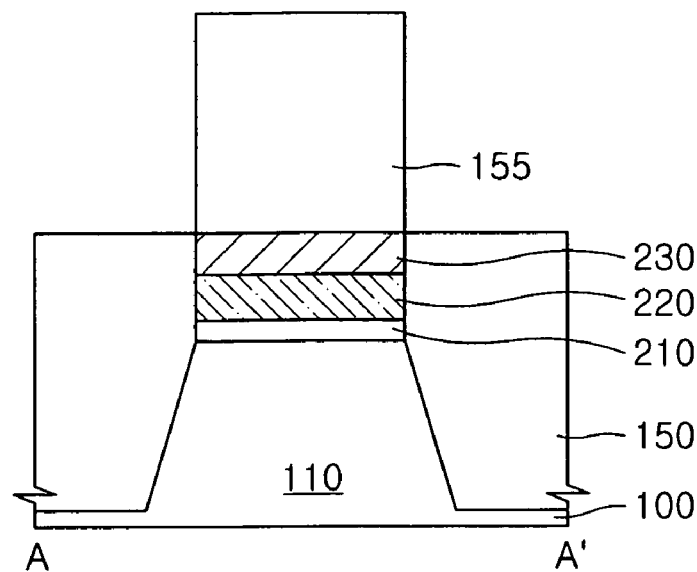
FIGS. 8 through 17 are sectional views schematically illustrating a non-volatile memory device for 2-bit operation and a method of fabricating the same according to a second embodiment of the present invention.
Figure 9:
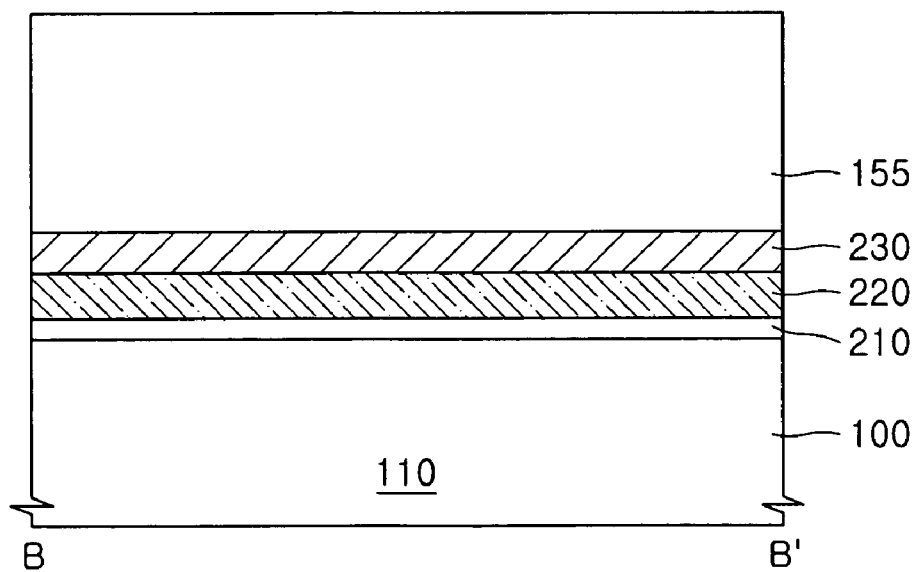
Figure 18:
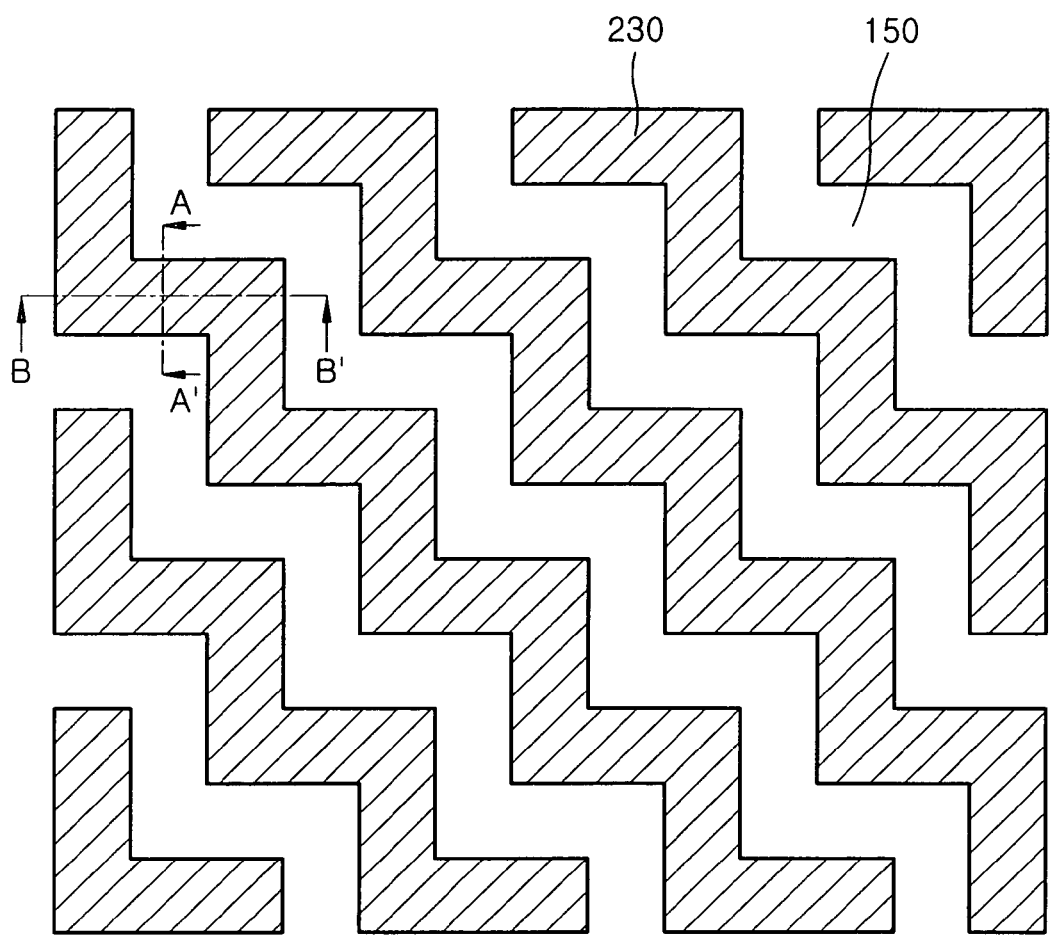
FIGS. 18 through 24 are plan views schematically illustrating a non-volatile memory device for 2-bit operation and a method of fabricating the same according to a second embodiment of the present invention.

Referring to FIGS. 8, 9 and 18, FIG. 8 is a sectional view taken along line A-A' of FIG. 18, and FIG. 9 is a sectional view taken along line B-B' of FIG. 18. As shown in FIG. 8, an isolation region 150 for defining an active region 110 after an active layout as shown in FIG. 2 is formed in a semiconductor substrate 100 such as a bulk silicon wafer or silicon on insulator (SOI) wafer.

A layer for storing charges, that is, a charge storage layer 220, is formed on the semiconductor substrate 100. A first dielectric layer as a tunnel dielectric layer 210 for tunneling of charges, particularly, electrons, is formed below the charge storage layer 220. The tunnel dielectric layer 210 may be preferably formed to include a silicon oxide layer.

The charge storage layer 220 is formed on the tunnel dielectric layer 210. The charge storage layer 220 may be formed to include a material being capable of capturing the electrons injected after tunneling, for example, a silicon nitride layer. For example, as an oxide-nitride-oxide (ONO) structure, or an oxide-silicon-oxide (OSO) structure, a structure including the tunnel dielectric layer 210, the charge storage layer 220, and a charge blocking layer 230 can be provided. The charge storage layer 220 may be composed of a material for storing charges such as a conductive polysilicon layer, a silicon dots layer, a silicon germanium (SiGe) layer, a nano crystal-aligned layer, and the like.

A charge blocking layer 230 for blocking back-tunneling during an erase operation of the non-volatile memory device may be formed on the charge storage layer 220. For example, the charge blocking layer 230 may be formed to include a silicon oxide layer.

Then, a hard mask 155 for the isolation region 150 defining the active region 110 is formed on the charge blocking layer 230 as shown in FIG. 8. The hard mask 155 may be preferably formed to include a silicon nitride layer.

Then, the tunnel dielectric layer 210, the charge storage layer 220, and the charge blocking layer 230 are patterned, using the hard mask 155 as an etch mask, thereby exposing an underneath portion of the semiconductor substrate 100. Since the hard mask 155 includes a pattern shape for realizing the active region 110 of FIG. 2, the tunnel dielectric layer 210, the charge storage layer 220, and the charge blocking layer 230 are patterned in the same shape as that of the active region 110 (FIG. 2) as shown in FIG. 18.

Then, the exposed portion of the semiconductor substrate 100 is etched using the hard mask 155 as an etch mask, thereby forming a trench, and an insulating layer is formed to fill the trench, thereby forming the isolation layer 150. Also, the isolation process may be performed by forming a LOCOS isolation region on the exposed semiconductor substrate 100 using the hard mask 155.

Then, the hard mask 155 is selectively removed, thereby forming an isolation region 150 for defining the active region 110 as shown in FIGS. 2 and 18, and concurrently forming a stack structure pattern including the tunnel dielectric layer 210, the charge storage layer 220, and the charge blocking layer 230 as the same pattern as that of the active region 110.

The charge storage layer 220 is formed to be confined inside the active region 110 (FIG. 2), and not to extend on the isolation region 150 by the process. Thus, charges are confined inside the memory cell, that is, the active region 110, and charge spreading between cells and a mutual interference phenomenon due to the charge spreading can be effectively suppressed or prevented.

Figure 10:
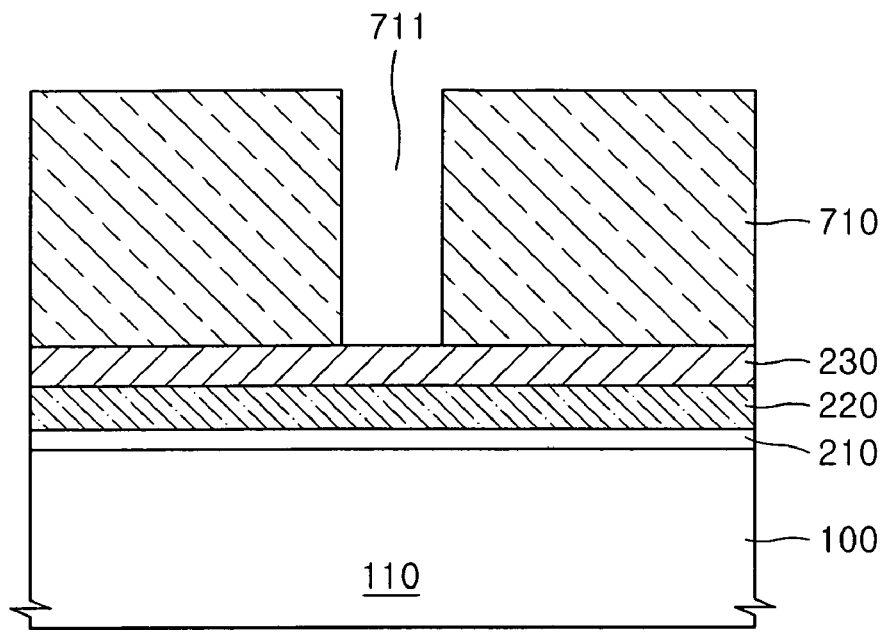
Figure 19:
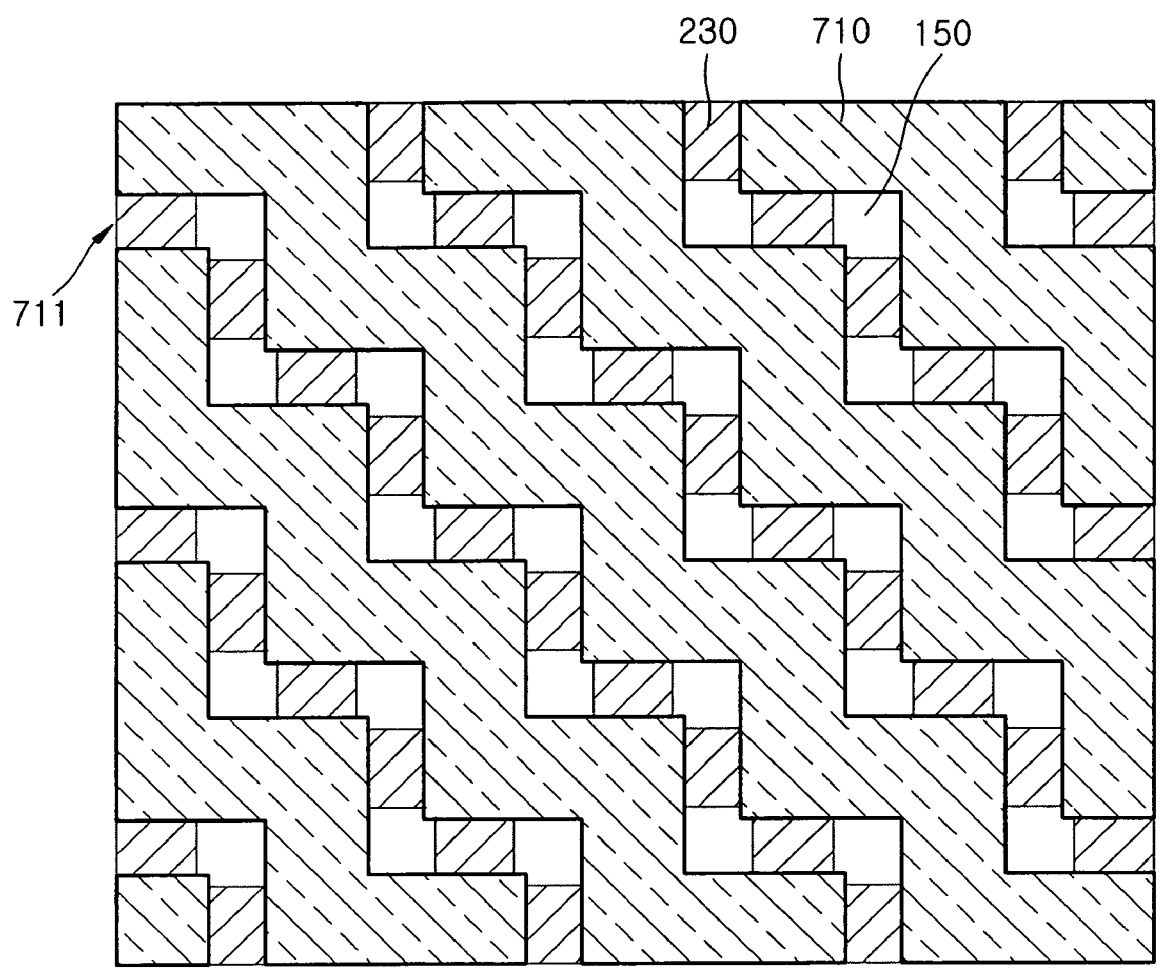

Referring to FIGS. 10 and 19, a first sacrificial layer 710 is formed as a mold to form the WL on the charge blocking layer 230 of the stack structure including the tunnel dielectric layer 210, the charge storage layer 220, and the charge blocking layer 230 patterned along the shape of the active region 110 or the outline. The first sacrificial layer 710 is patterned in zigzag pattern shape as shown in FIG. 19, and the zigzag pattern is formed as a pattern for a second zigzag pattern shape of the WL 300 of FIG. 3.

For example, the first sacrificial layer 710 is patterned to have an opening 711 for a WL 300 as shown in FIG. 10. A line width of the opening 711 may be formed smaller than the line width of the WL 300 to be formed. Thus, the opening 711 has a shape similar to the second zigzag pattern of the WL 300 of FIG. 3 as shown in FIG. 19, but may be formed with a zigzag pattern having a relatively small line width.

Thus, the first sacrificial layer 710 may be formed as a zigzag pattern crossing the active region 110 (FIG. 2), and the opening 711 of the first sacrificial layer 710 is exposed by crossing a portion of the charge blocking layer 230 as shown in FIG. 10. Further, the opening 711 is formed such that the isolation region 150 adjacent to the pattern of the charge blocking layer 230 is exposed as shown in FIG. 19.

Figure 11:
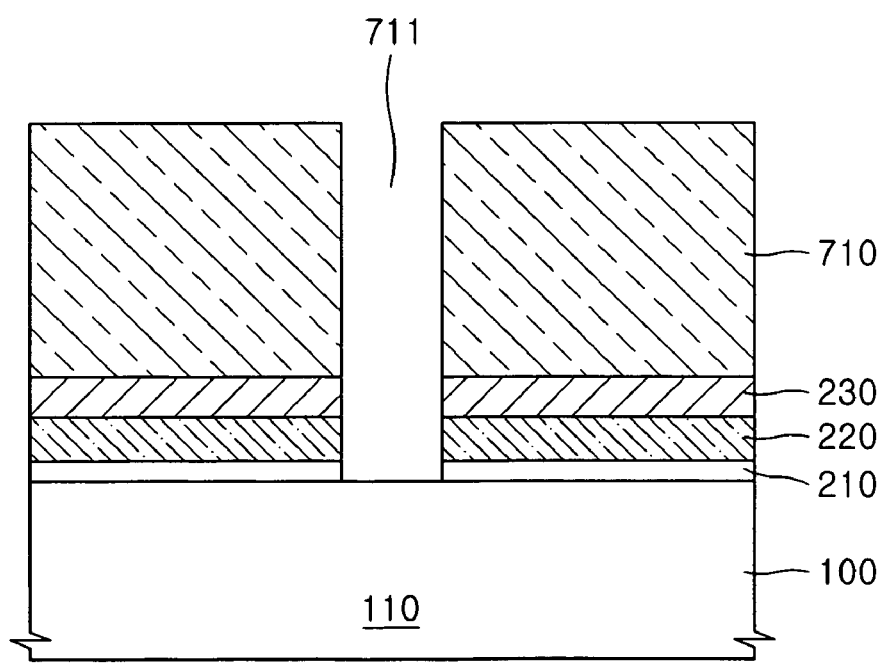
Figure 20:
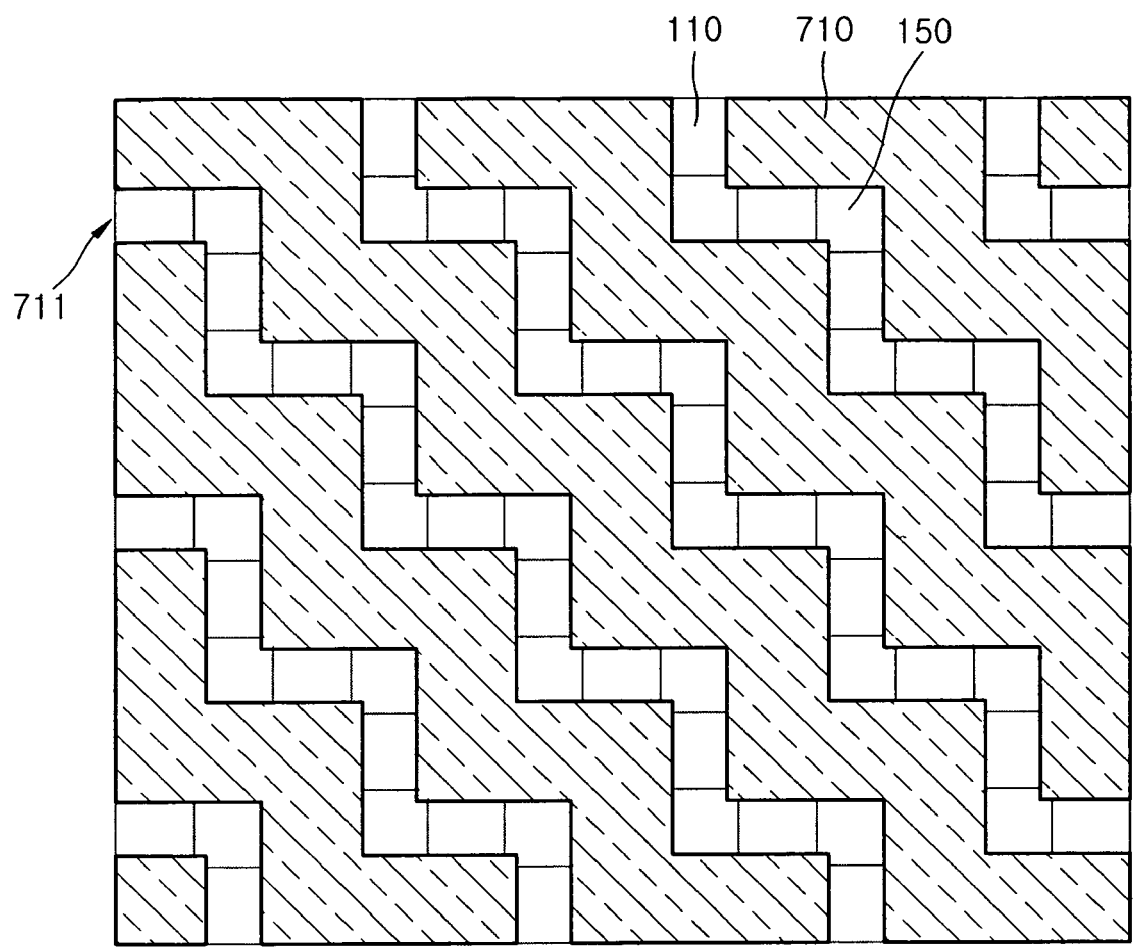

Referring to FIGS. 11 and 20, after the first sacrificial layer 710 is formed, an exposed portion of the charge blocking layer 230 is selectively etched, using the first sacrificial layer 710 as an etch mask. Exposed portions of the charge storage layer 220 and the tunnel dielectric layer 210 are also selectively etched. Thus, the stack structure pattern of the tunnel dielectric layer 210, the charge storage layer 220, and the charge blocking layer 230, which are patterned to extend along the active region 110 as shown in FIG. 11, is separated into pieces, and a portion of the active region 110 of the underneath semiconductor substrate 100 is exposed as shown in FIG. 20.

Figure 12:
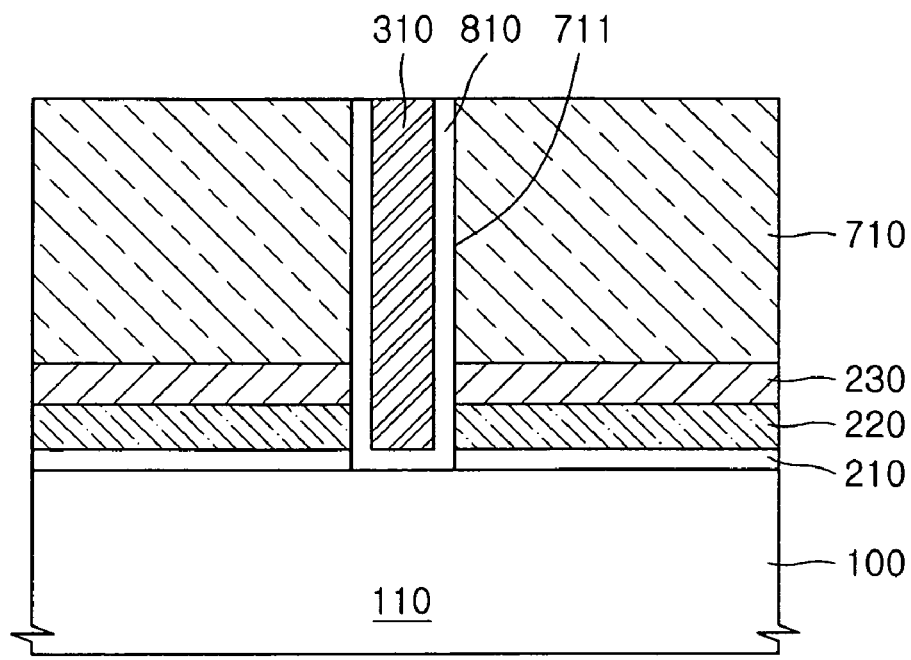
Figure 21:
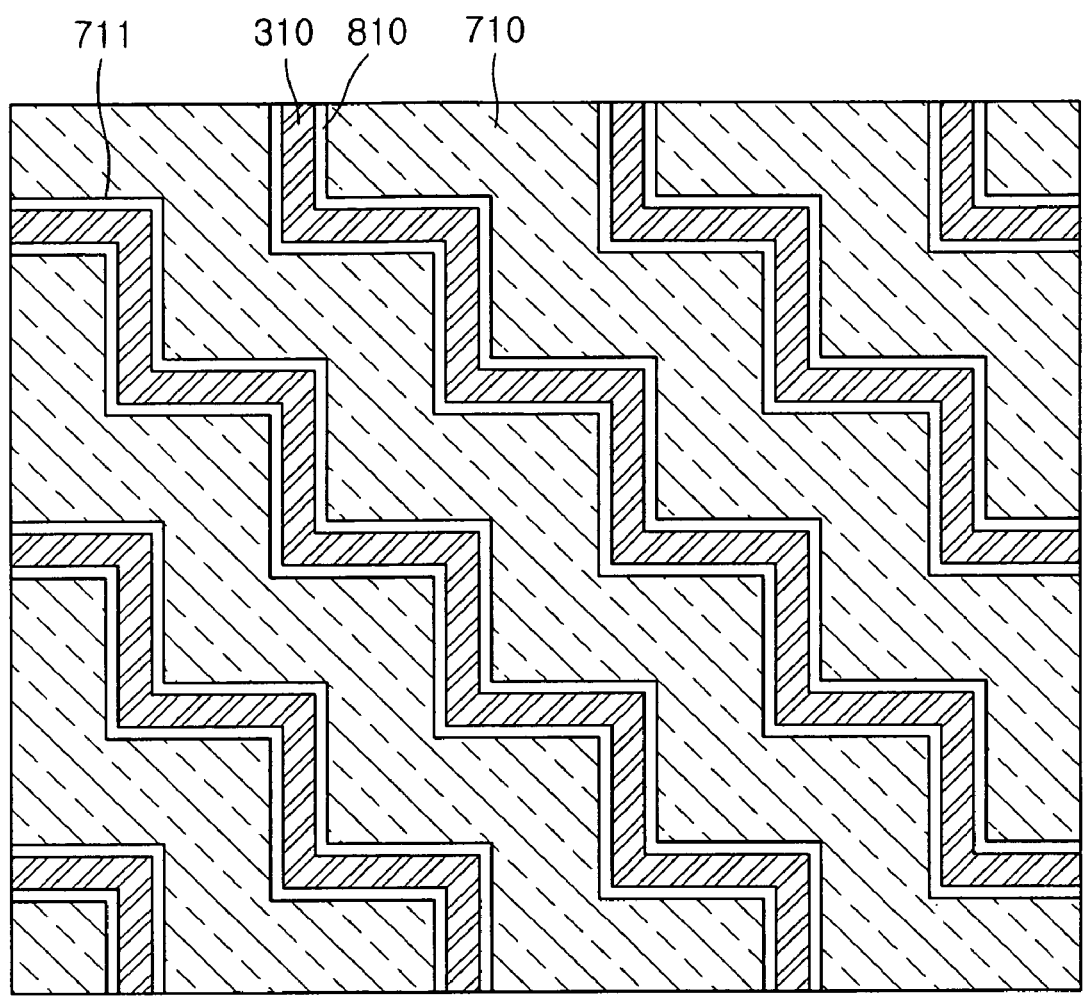

Referring to FIGS. 12 and 21, a second dielectric layer as a gate dielectric layer 810 is formed on the semiconductor substrate 100 exposed to the opening 711 of the first sacrificial layer 710. The gate dielectric layer 810 is disposed at the interface between a subsequent gate and the active region 110 of the semiconductor substrate 100. The gate dielectric layer 810 may be preferably formed to include a silicon oxide layer, and may extend to cover the sidewalls of the first sacrificial layer 710.

Then, a first gate 310 is formed on the gate dielectric layer 810 to fill the opening 711 of the first sacrificial layer 710. The first gate 310 may be used to constitute a portion of the WL 300 of FIG. 2. Since the first sacrificial layer 710 is formed in a zigzag pattern as shown in FIG. 21, and thus, the opening 711 is also formed in a zigzag pattern, the first gate 310 is also patterned in a zigzag pattern. The zigzag pattern of the first gate 310 follows the pattern shape of the second zigzag pattern of the WL 300 of FIG. 2, but the line width of the first gate 310 may be narrower than that of the WL 300.

The first gate 310 may be formed to include a conductive material to constitute a gate of the transistor, for example, conductive polysilicon, a fully silicide layer, or a metal layer.

Figure 13:
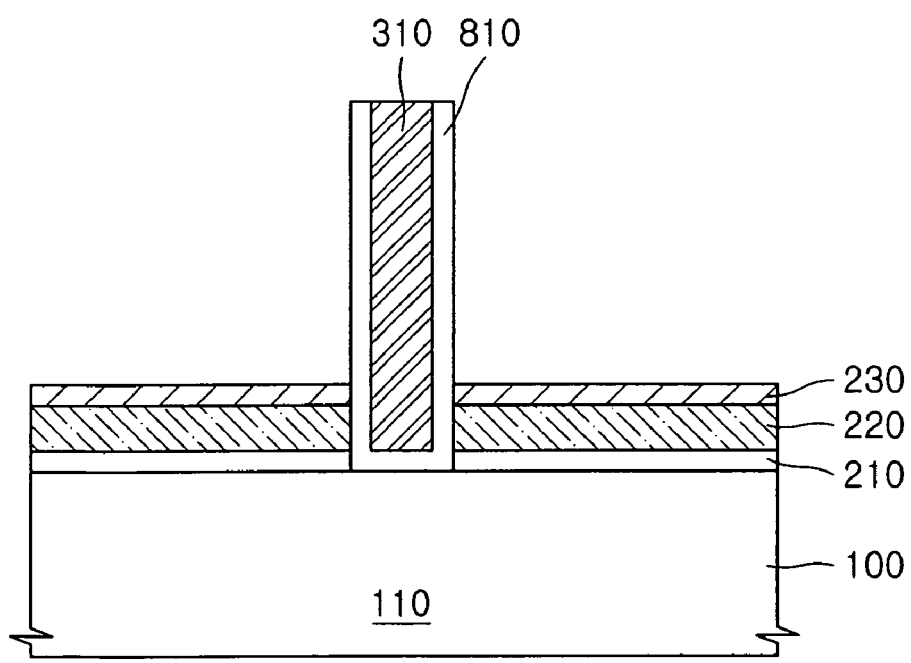

Referring to FIG. 13, after the first gate 310 is formed, the first sacrificial layer 710 is selectively removed. Thus, the upper surface of the underneath charge blocking layer 230 covering the first sacrificial layer 710, a portion of the active region 110, and a portion of the isolation region 150 are exposed.

Figure 14:
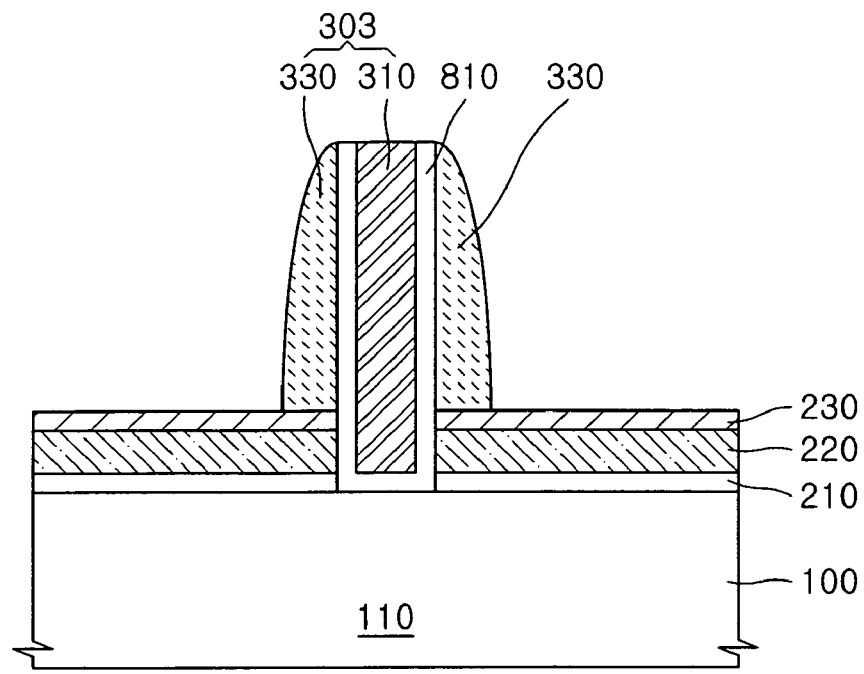

Referring to FIG. 14, a second gate 330 exposed by the removal of the first sacrificial layer 710 is formed to be attached as a spacer shape to the sidewalls of the gate dielectric layer 810. For example, after a conductive layer such as polysilicon, or a silicide layer, or a metal layer is formed, an overall etch such as a spacer etch is performed, thereby forming a spacer-shaped second gate 330. Thus, a gate 303 including the first and second gates 310, 330 is formed in a second zigzag pattern as the same pattern as that of the WL 300 as shown in FIG. 2.

Figure 15:
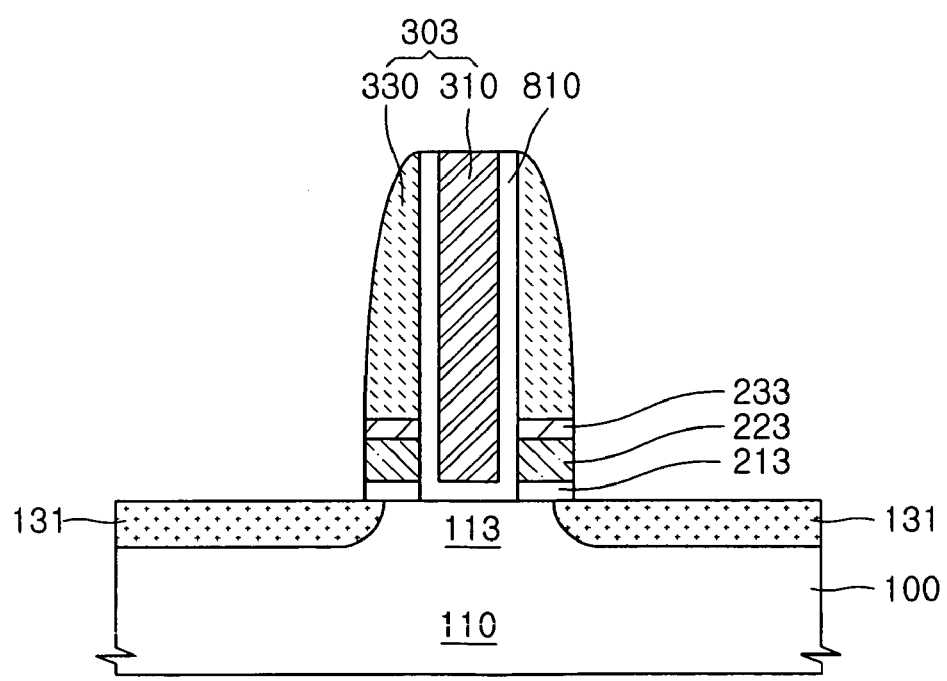
Figure 22:
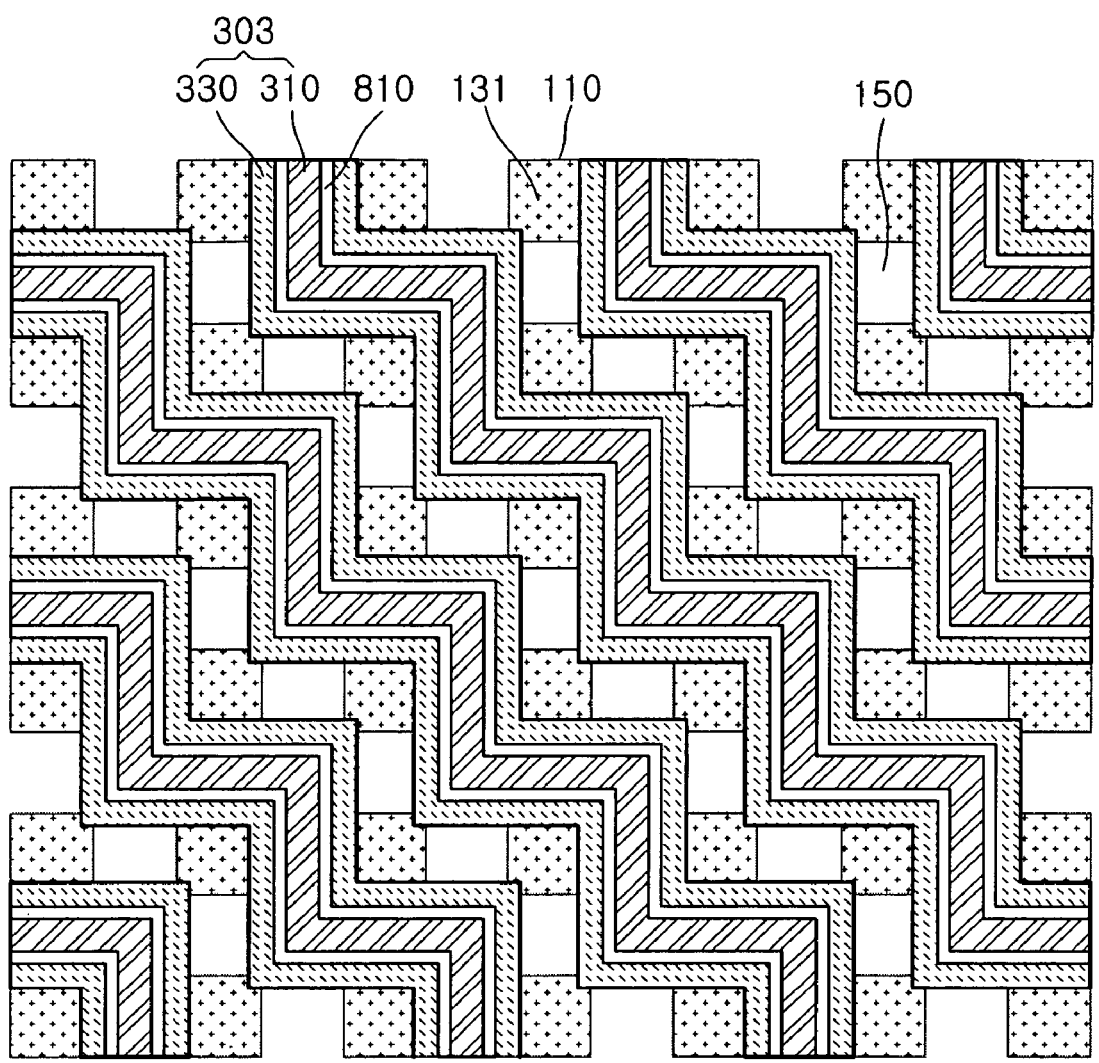

Referring to FIGS. 15 and 22, a portion of the charge blocking layer 230 exposed out of the both sides of the second gate 330 is etched and removed, using the first gate 310 and the second gate 330 as etch masks, and the underneath charge storage layer 220 and the tunnel dielectric layer 210 are etched and removed.

Thus, the charge storage layer pattern 223 is formed as a locally separated pattern as shown in FIG. 15. The charge storage layer pattern 223 is isolated as a pattern confined only inside the active region 110 like the charge storage layer 200 as shown in FIG. 5, and is patterned not to extend to the isolation region 150.

That is, the charge storage layer 220 is first patterned to be confined into the active region 110 during the process of forming the isolation region 150 defining the active region 110 as shown in FIG. 18. Then, a portion of the charge storage layer 220 exposed by the second gate 330 is etched and removed to be secondly patterned as shown in FIG. 15, thereby forming a charge storage layer pattern 223. Thus, the charge storage layer pattern 223 is substantially confined and isolated inside the active region 110 below the second gate 330. Thus, the two charge storage layer patterns 223 are symmetrically formed on both sides of the first gate 310 separated from each other.

With the charge storage layer pattern 223 is formed, a charge blocking layer pattern 233 and a tunnel dielectric layer pattern 213 on and below the charge storage layer pattern 223 are also patterned and formed as local patterns.

After the charge storage layer pattern 223 is formed, impurity ions are implanted into an exposed region of the active region 110 adjacent to the gate 303 using the gate 303 as an ion implantation mask, thereby forming a first impurity region 131. The first impurity region 131 may be used to form the source/drain regions of the transistor as a lightly doped drain structure. The active region 110 below the gate 303 between the first impurity regions 131 is formed as a channel region 113.

Figure 16:
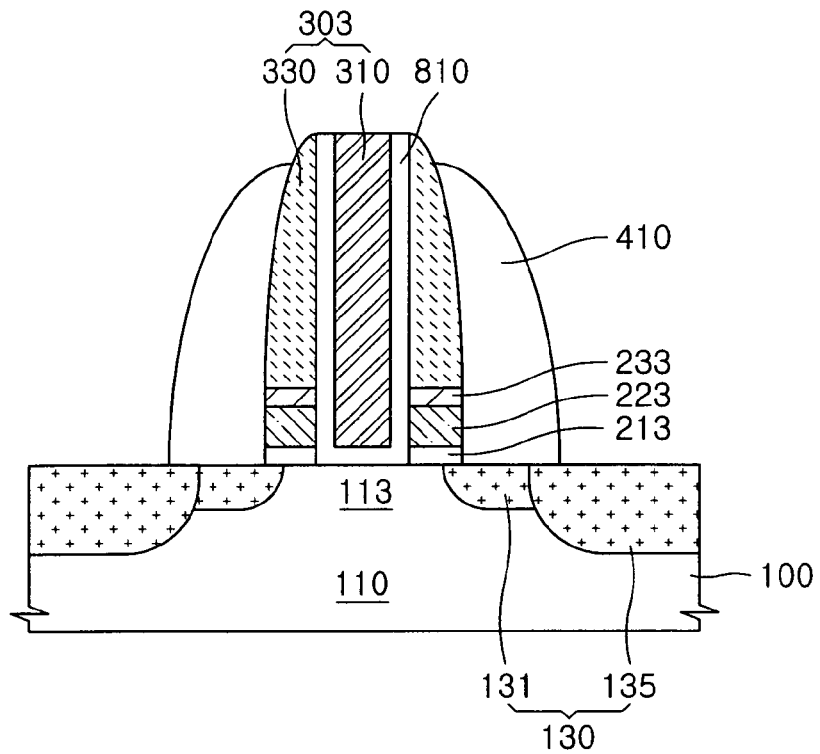
Figure 23:
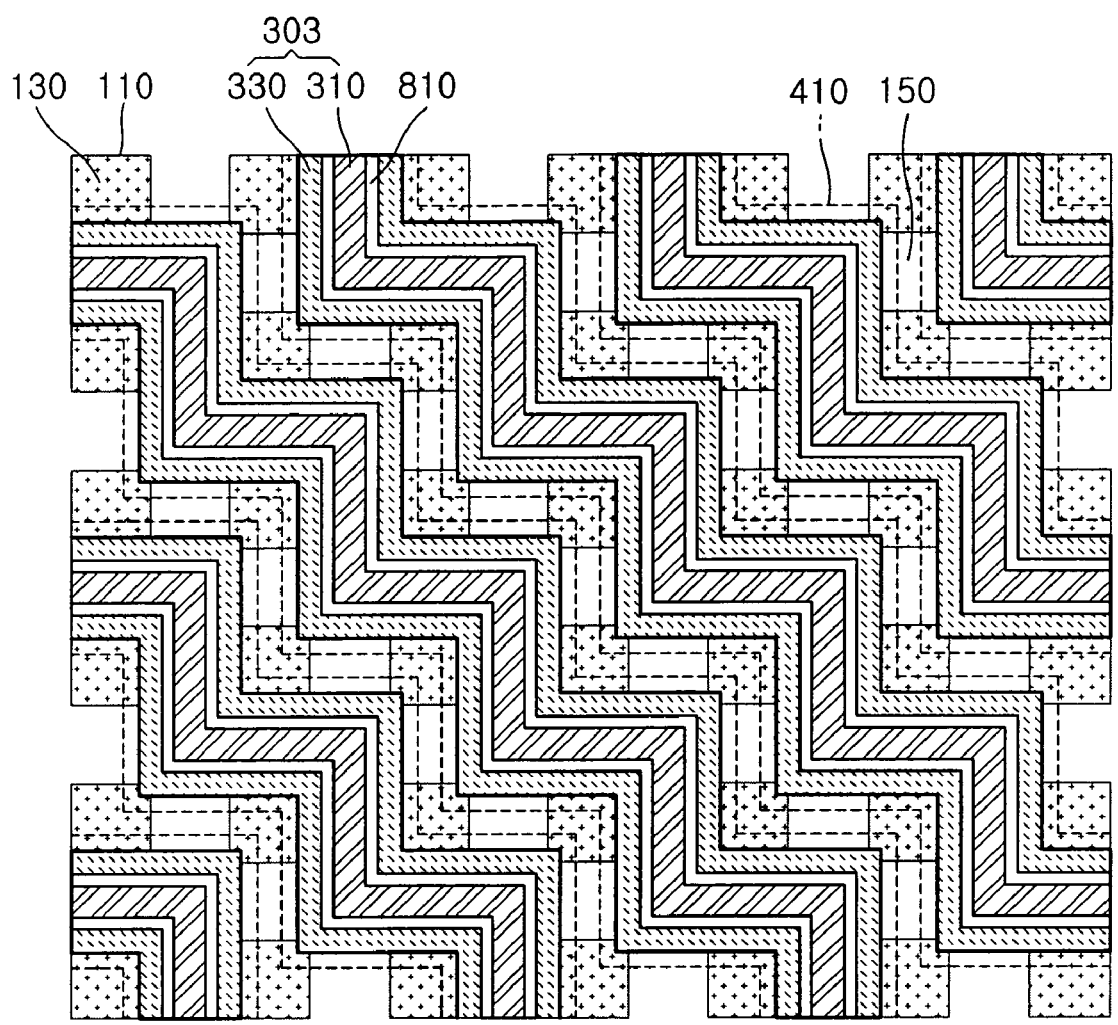

Referring to FIGS. 16 and 23, a sidewall insulating spacer 410 is formed to cover and protect the sidewalls of the exposed second gate 330 and the sidewalls of the charge storage layer pattern 223. The insulating spacer 410 may be formed to include a silicon nitride layer and/or a silicon oxide layer.

Then, an ion implantation process is performed on the active region 110 exposed by the insulating spacer 410, using the insulating spacer 410 as an ion implantation mask. Thus, source/drain regions 130 including the first and second impurity regions 131, 135 are formed. As shown in FIG. 23, the source/drain regions 130 are formed as portions exposed by the gate 303 crossing the active region 110, that is, WL.

Figure 17:
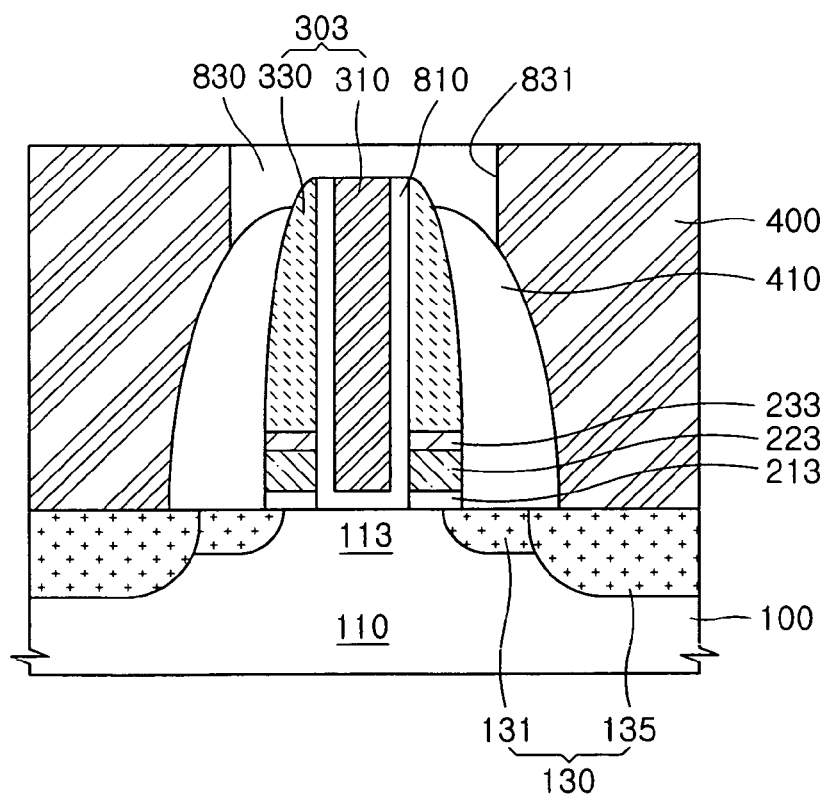
Figure 24:
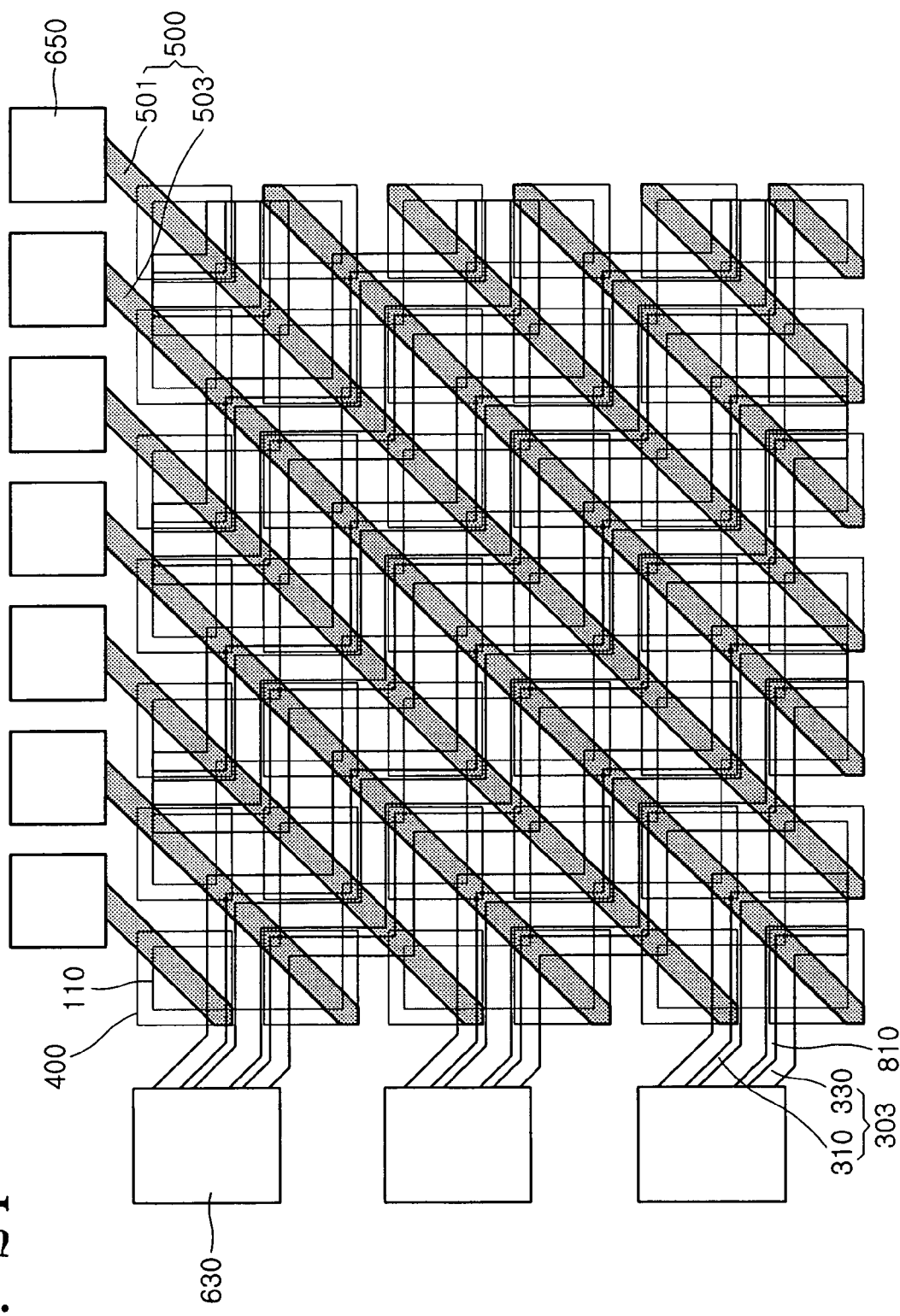

Referring to FIGS. 17 and 24, after an insulating layer 830 covering the gate 303 and the like is formed, a contact hole 831 penetrating the insulating layer 830 and exposing the source/drain region 130 is formed. The contact hole 831 is formed during the process of forming an SAC contact, and may be formed to expose the sidewalls of the spacer 410 in order to ensure a process margin. Then, a connecting contact 400 connected to the bit line filling the contact hole 831 is formed to include a conductive layer. Since the connecting contact 400 is formed by the SAC formation process, the process margin can be further ensured.

Then, as shown in FIG. 24, a bit line 500 such as a BL1 501 and a BL2 503 being connected to the connecting contact 400 is formed in the same way as described in reference to FIG. 7. Since two BL 501, 503 are formed in across with one WL, that is, the gate 303, the memory cell may operate in 2-bit mode.

FIGS. 25 through 31 are sectional views schematically illustrating a non-volatile memory device for 2-bit operation and a method of fabricating the same according to a third embodiment of the present invention, and FIGS. 32 through 37 are plan views schematically illustrating a non-volatile memory device for 2-bit operation and a method of fabricating the same according to the third embodiment of the present invention.

The third embodiment of the present invention provides a process of forming a gate of a transistor and a structure by a different way from the second embodiment without a spacer-shaped second gate 330 (FIG. 17).

An isolation region 150 for defining an active region 110 following an active layout as shown in FIG. 2 is formed on a semiconductor substrate 100.

Figure 25:
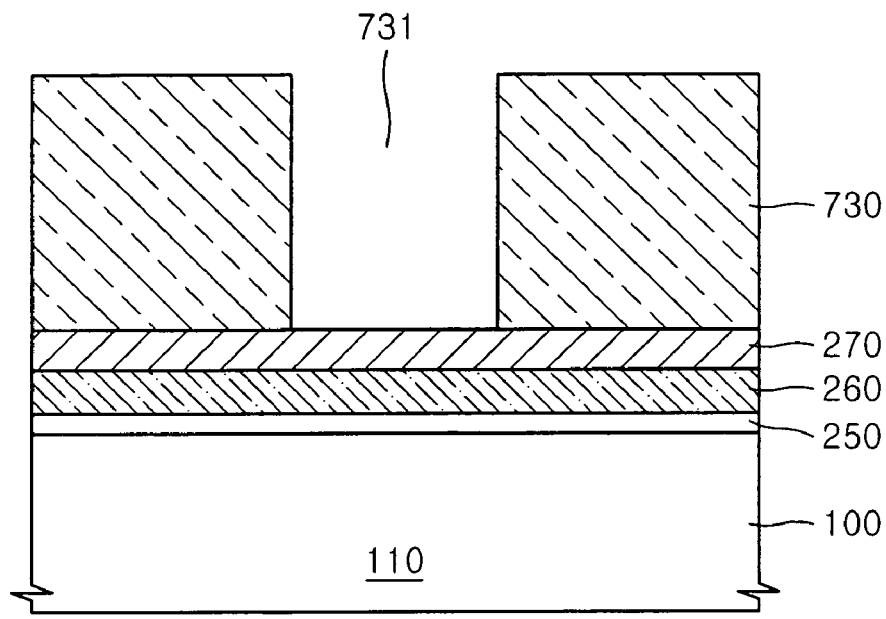
FIGS. 25 through 31 are sectional views schematically illustrating a non-volatile memory device for 2-bit operation and a method of fabricating the same according to a third embodiment of the present invention.

Referring to FIG. 25, a layer for charge storage, that is, a charge storage layer 260 is formed on the semiconductor substrate 100, and a first dielectric layer as a tunnel dielectric layer 250 is formed, and a charge blocking layer 270 is formed on the charge storage layer 260.

Then, a hard mask for an isolation region 150 defining the active region 110 in the semiconductor substrate 100 as shown in FIG. 8 is formed on the charge blocking layer 270. The tunnel dielectric layer 250, the charge storage layer 260, and the charge blocking layer 270 are patterned, using the hard mask as an etch mask, thereby exposing a portion of the underneath semiconductor substrate 100. Since the hard mask includes a pattern shape for realizing the active region 110 of FIG. 2, the tunnel dielectric layer 250, the charge storage layer 260, and the charge blocking layer 270 are patterned in the same shape as the active region 110 (FIG. 2) as shown in FIG. 18.

Then, an isolation region 150 (FIG. 18) is formed in the semiconductor substrate 100 exposed to the hard mask. Then, the hard mask is selectively removed, thereby forming the isolation region 150 defining the active region 110 as shown in FIGS. 2 and 18, and concurrently, forming a stack structure including the tunnel dielectric layer 250, the charge storage layer 260, and the charge blocking layer 270 in the same pattern as the active region 110 as shown in FIG. 25.

The charge storage layer 260 is confined inside the active region 110 (FIG. 2) by the process, and does not extend to the isolation region 150. Thus, charges are confined inside the memory cell, that is, the active region 110, and charge spreading between cells and a mutual interference phenomenon due to the charge spreading can be effectively suppressed or prevented.

Figure 32:
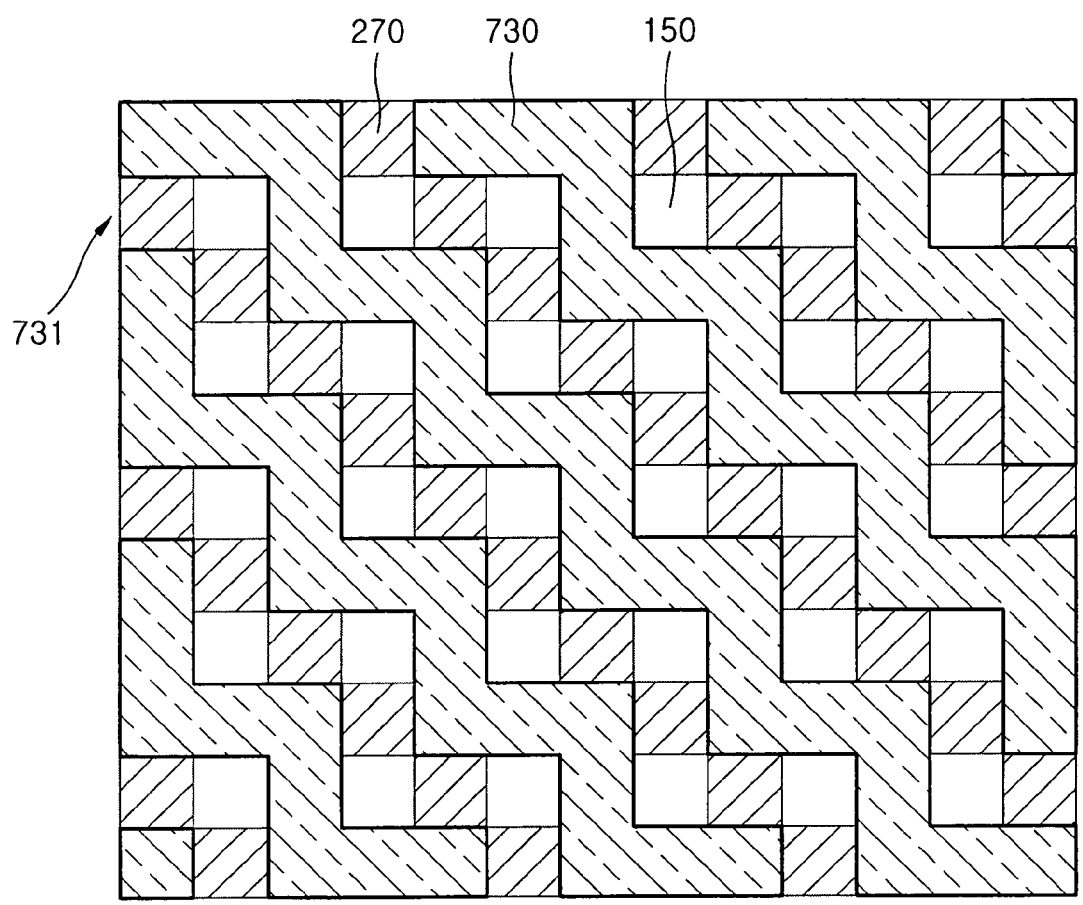
FIGS. 32 through 37 are plan views schematically illustrating a non-volatile memory device for 2-bit operation and a method of fabricating the same according to a third embodiment of the present invention.

Referring to FIGS. 25 and 32, a second sacrificial layer 730 is formed as a mold to form the WL on the charge blocking layer 270 of the stack structure including the tunnel dielectric layer 250, the charge storage layer 260, and the charge blocking layer 270 patterned along the shape of the active region 110 or the outline. The second sacrificial layer 730 is formed as a zigzag pattern for a second zigzag pattern shape of the WL 300 of FIG. 3.

For example, the second sacrificial layer 730 is patterned to have a second opening 731 for the WL 300 as shown in FIG. 10. A line width of the second opening 731 may be formed with a line width equal to a line width of the WL 300 to be formed. Thus, the second opening 731 may be formed with the shape similar to the second zigzag pattern of the WL 300 of FIG. 3.

Figure 26:
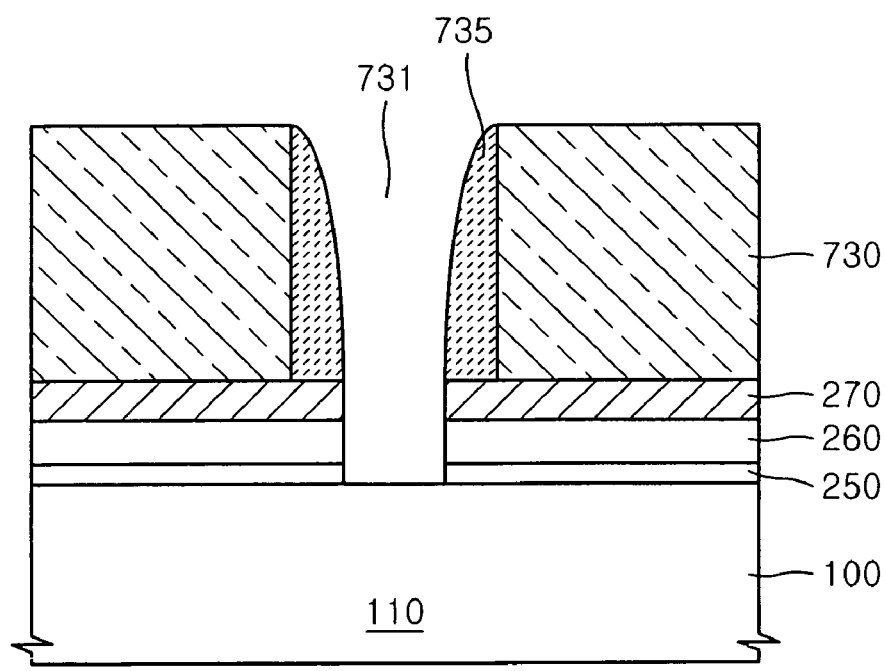
Figure 33:
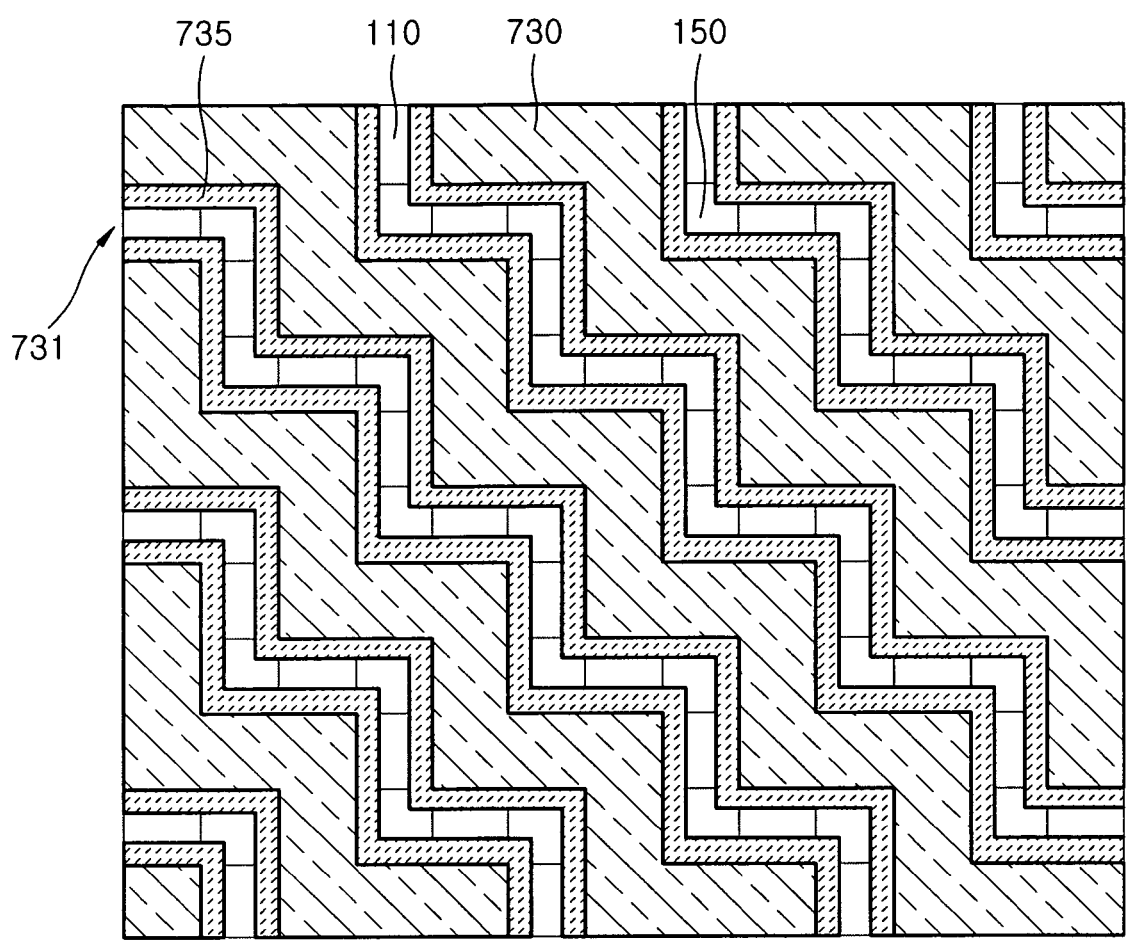

Referring to FIGS. 26 and 33, after the second sacrificial layer 730 is formed, a sacrificial spacer 735 is formed on the inner sidewall of the second sacrificial layer 730. The sacrificial spacer 735 may be formed to include an insulating material, and substantially functions to reduce a line width of the second opening 731. Therefore, an exposed portion of the underneath charge blocking layer 270 exposed to the second opening 731 is relatively scaled down.

Using the second sacrificial layer 730 and the sacrificial spacer 735 as etch masks, the exposed portion of the charge blocking layer 270 is selectively etched, and thus, an exposed portion of the underneath charge storage layer 260 and an exposed portion of the tunnel dielectric layer 250 are also selectively etched. Thus, the stack structure pattern of the tunnel dielectric layer 250, the charge storage layer 260, and the charge blocking layer 270, which are patterned to extend along the active region 110 as shown in FIG. 26, is separated into pieces, and a portion of the active region 110 of the underneath semiconductor substrate 100 is exposed as shown in FIG. 32.

Figure 27:
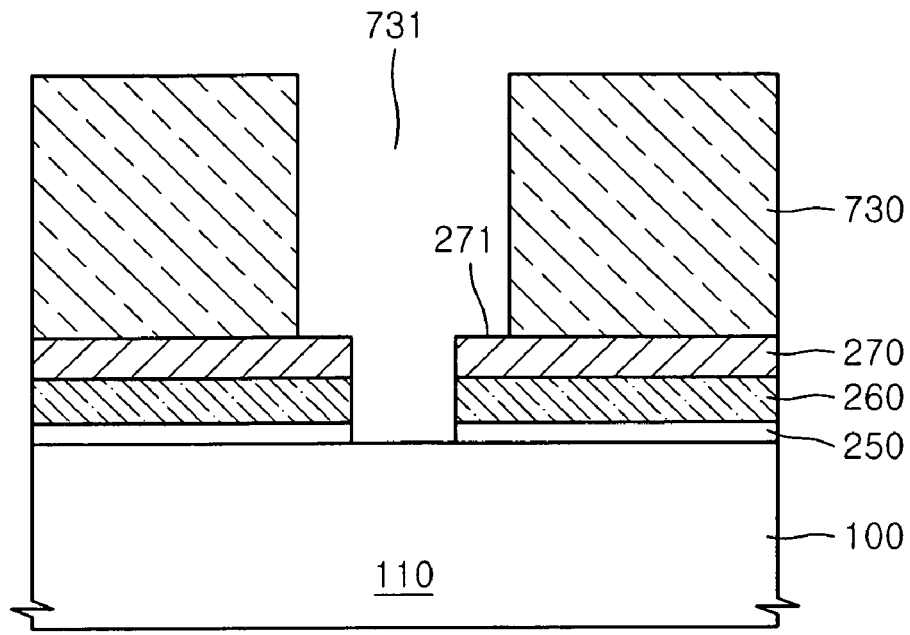

Referring to FIG. 27, the sacrificial spacer 735 (FIG. 26) is selectively removed.

Figure 28:
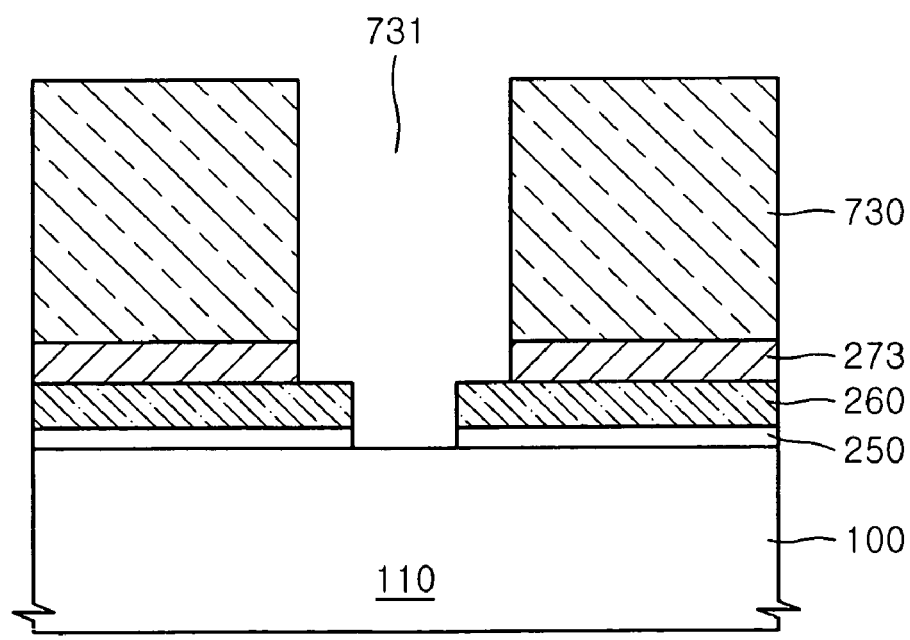
Figure 34:
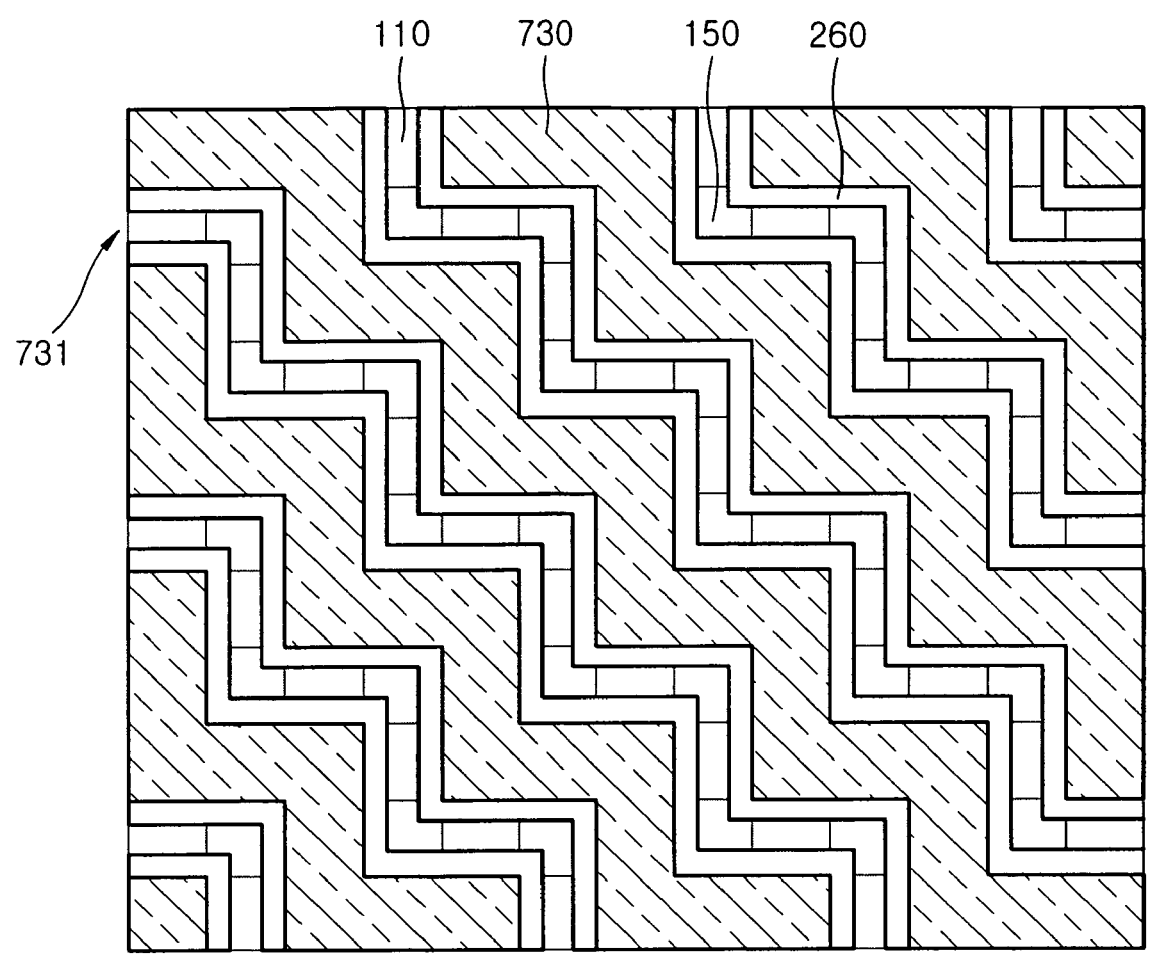

Referring to FIGS. 28 and 34, an exposed portion 271 of the charge blocking layer 270 exposed by the removal of the sacrificial spacer 735 is selectively removed using the second sacrificial layer 730 as an etch mask. Thus, a charge blocking layer dummy pattern 273 selectively exposing the underneath charge storage layer 260 is formed. The processes may be optionally omitted in accordance with processing.

Figure 29:
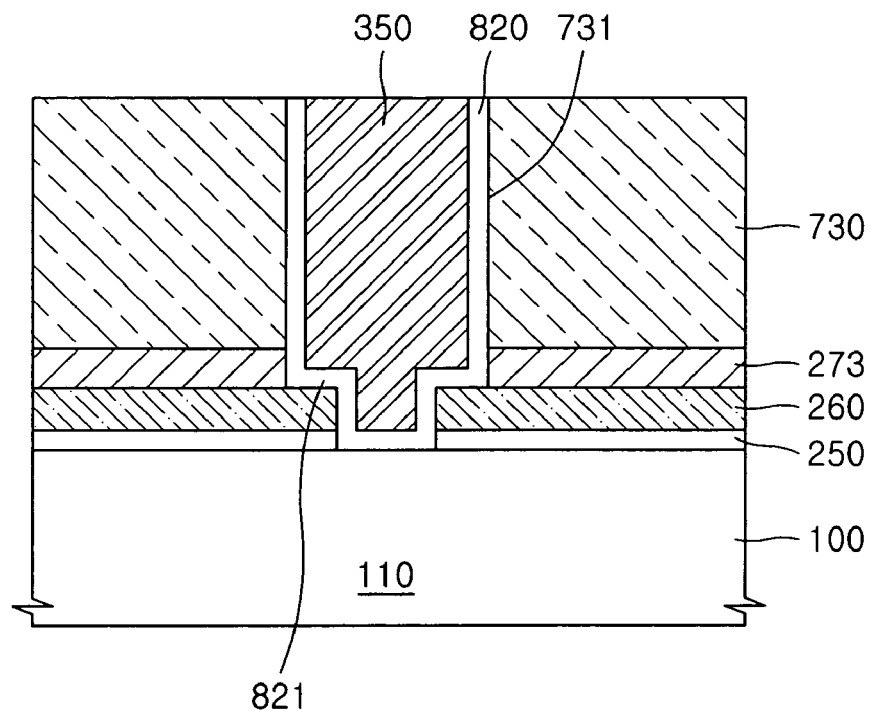
Figure 35:
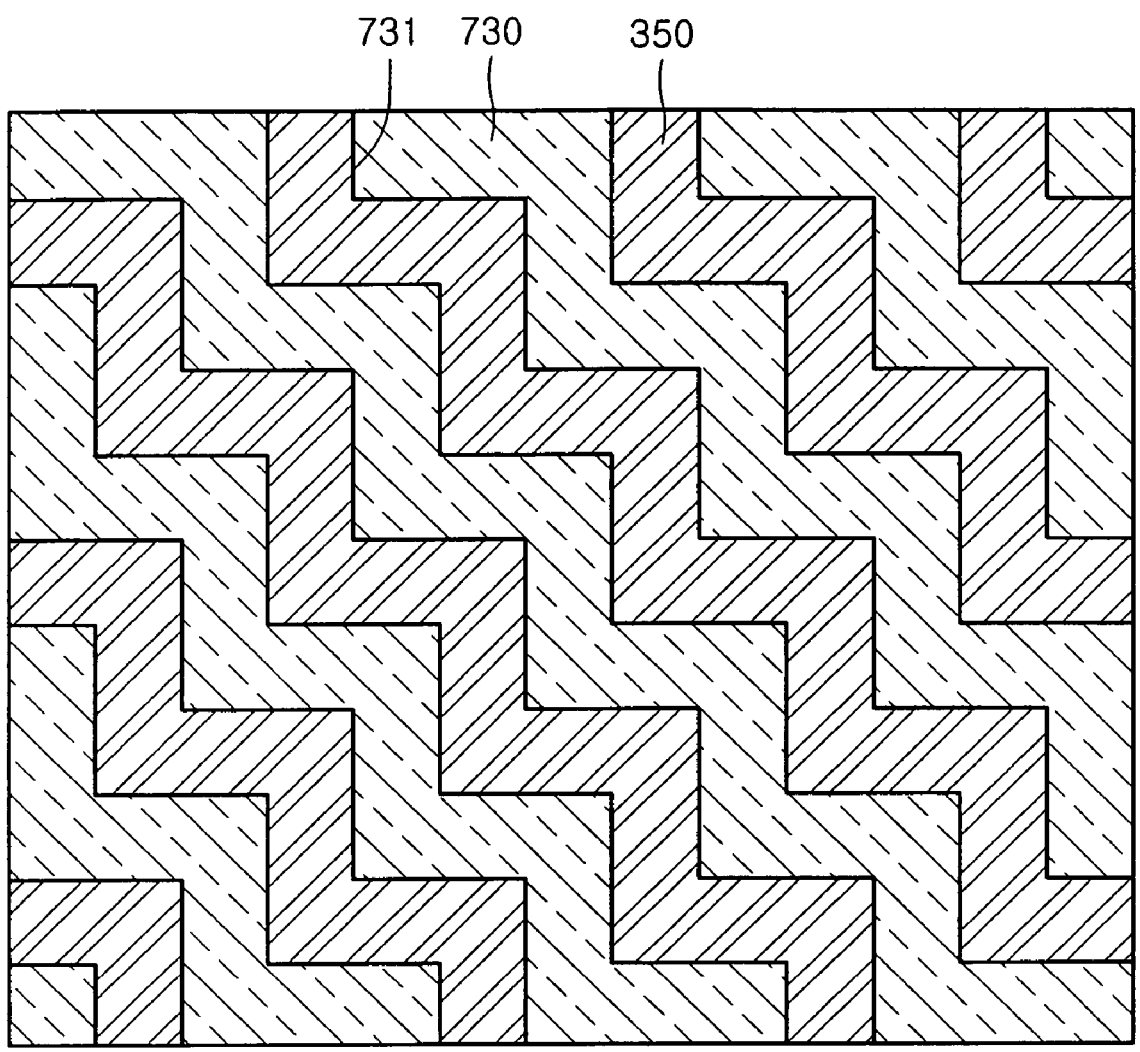

Referring to FIGS. 29 and 35, a second dielectric layer as a gate dielectric layer 820 is formed on the semiconductor substrate 100 exposed to the second opening 731 of the second sacrificial layer 730. The gate dielectric layer 820 is disposed at the interface between a subsequent gate 350 and the active region 110 of the semiconductor substrate 100. The gate dielectric layer 820 may be preferably formed to include a silicon oxide layer, and may extend to cover the sidewall of the second sacrificial layer 730 and the exposed portion of the charge storage layer 260. A portion 821 of the gate dielectric layer 820 covering the charge storage layer 260 is substantially used as a charge blocking layer.

Then, the gate 350 is formed on the gate dielectric layer 820 to fill the second opening 731 of the second sacrificial layer 730. The gate 350 may be used to constitute the WL 300 of FIG. 2. The second sacrificial layer 730 is formed in a zigzag pattern as shown in FIG. 35, and thus, since the second opening 731 is also formed in a zigzag pattern, the gate 350 is also patterned in a zigzag pattern. The zigzag pattern of the gate 350 may be understood to follow the pattern shape of the second zigzag pattern of the WL 300 of FIG. 2.

Figure 30:
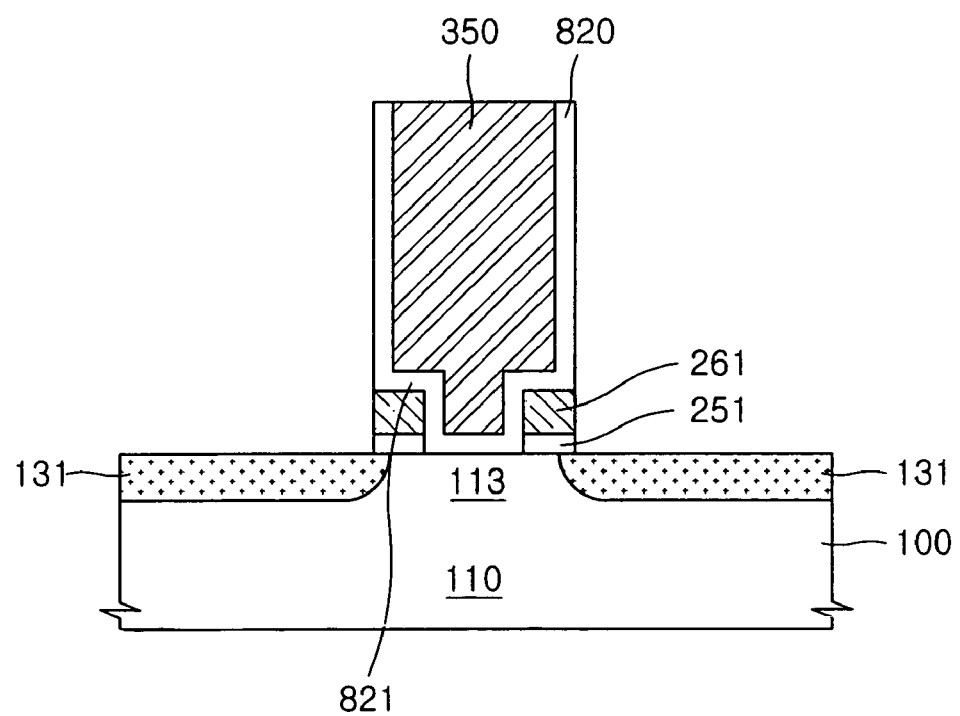
Figure 36:
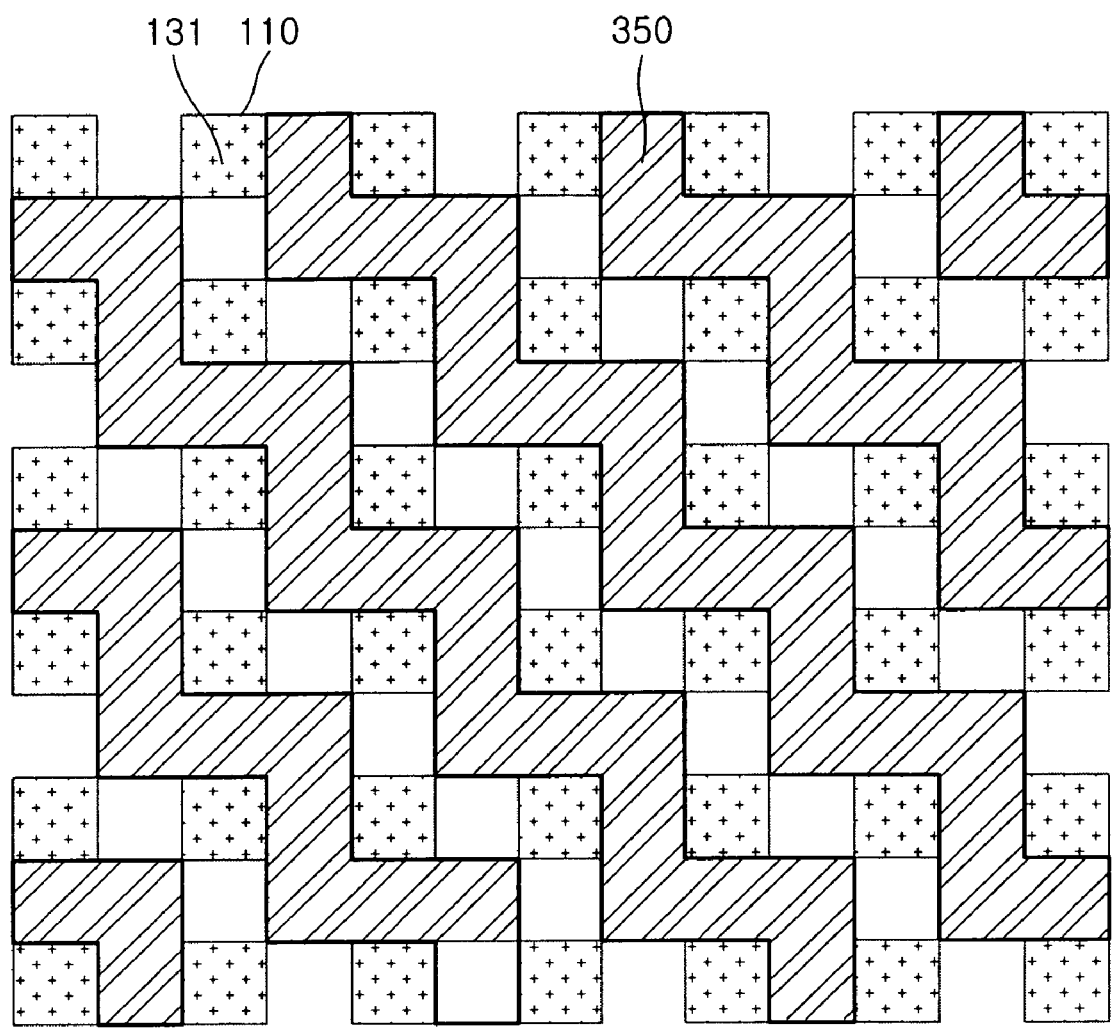

Referring to FIGS. 30 and 36, after the gate 350 is formed, the second sacrificial layer 730 is selectively removed. Thus, an upper surface of the underneath charge blocking layer dummy pattern 273 covering the second sacrificial layer 730, a portion of the active region 110, and a portion of the isolation region 150 are exposed. Using the gate 350 as an etch mask, the portion of the charge blocking layer dummy pattern 273 exposed out of the both sides of the gate 350 is etched and removed, and then, a portion of the underneath charge storage layer 260 and a portion of the tunnel dielectric layer 250 are etched and removed.

Thus, the charge storage layer pattern 261 is formed as a locally separated pattern as shown in FIG. 30. The charge storage layer pattern 261 is formed as a separated pattern confined only inside the active region 110 like the charge storage layer 200 as shown in FIG. 5, and is patterned not to extend to the isolation region 150.

That is, the charge storage layer 260 is first patterned to be confined into the active region 110 during the process of forming the isolation region 150 defining the active region 110. Then, the exposed portion of the charge storage layer 260 exposed by the gate 350 as shown in FIG. 30 is etched and removed and secondly patterned, thereby forming a charge storage layer pattern 261. Thus, the charge storage layer pattern 261 is substantially isolated to be confined to a portion below the gate 350 inside the active region 110, that is, below a charge storage layer portion 821 as an extending portion of the gate dielectric layer 820. Thus, two charge storage layer patterns 261 are symmetrically formed on both sides below the gate 350 separated from each other.

With the charge storage layer pattern 261 patterned, the tunnel dielectric layer pattern 251 below the charge storage layer pattern 261 is also patterned, thereby forming a local pattern.

After the charge storage layer pattern 261 is formed as above, impurity ions are implanted into an exposed region of the active region 110 adjacent to the gate 350, using the gate 350 as an ion implantation mask, thereby forming a first impurity region 131. The first impurity region 131 may be used to form the source/drain regions of the transistor as an LDD structure. The active region 110 below the gate 350 between the first impurity regions 131 is formed as a channel region 113.

Figure 31:
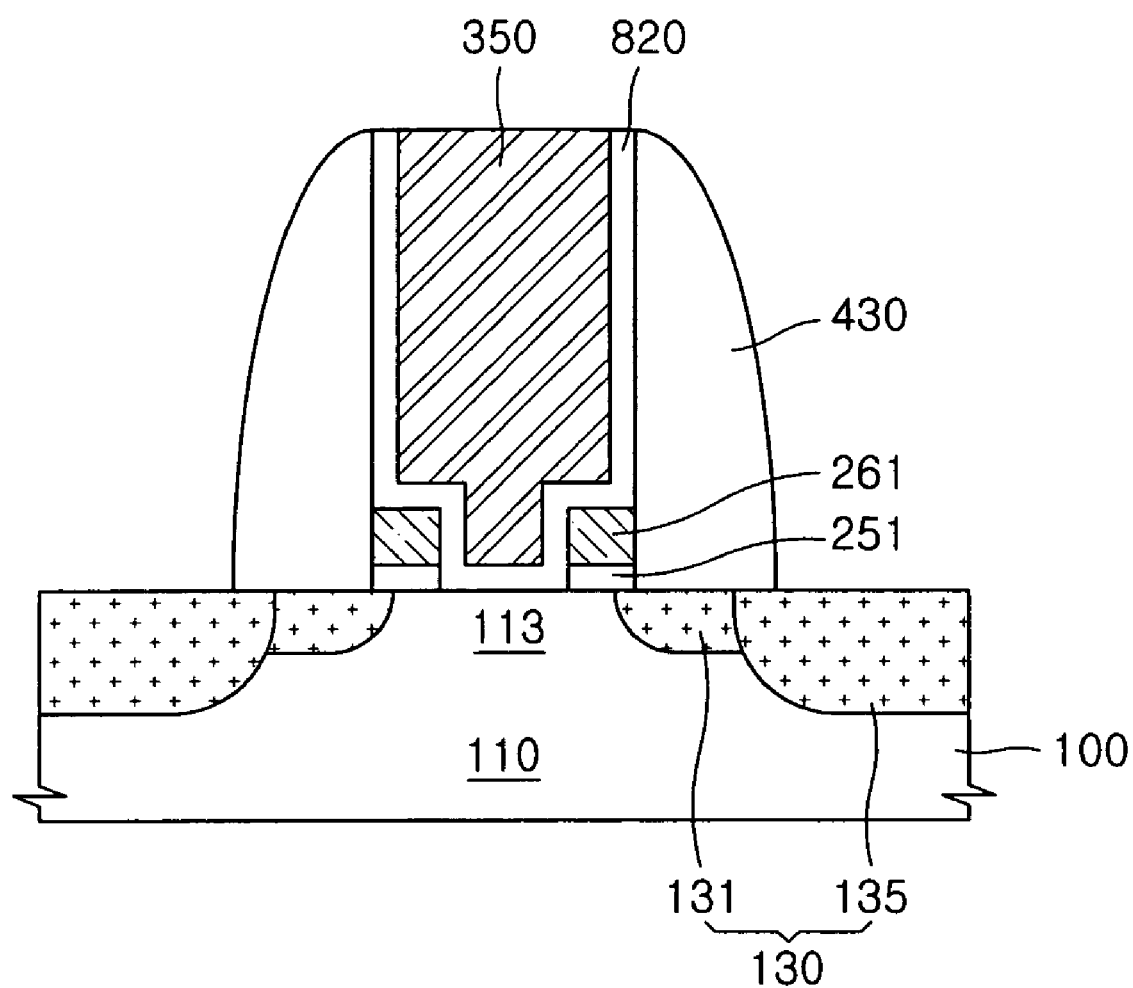

Referring to FIG. 31, a sidewall insulating spacer 430 is formed to cover and protect the sidewalls of the exposed gate 350 and the sidewalls of the exposed charge storage layer pattern 261. Then, an ion implantation process is performed on the active region 110 exposed by the insulating spacer 430, using the insulating spacer 430 as an ion implantation mask, thereby forming a second impurity region 135. Thus, source/drain regions 130 including the first and second impurity ions 131, 135 are formed.

Figure 37:
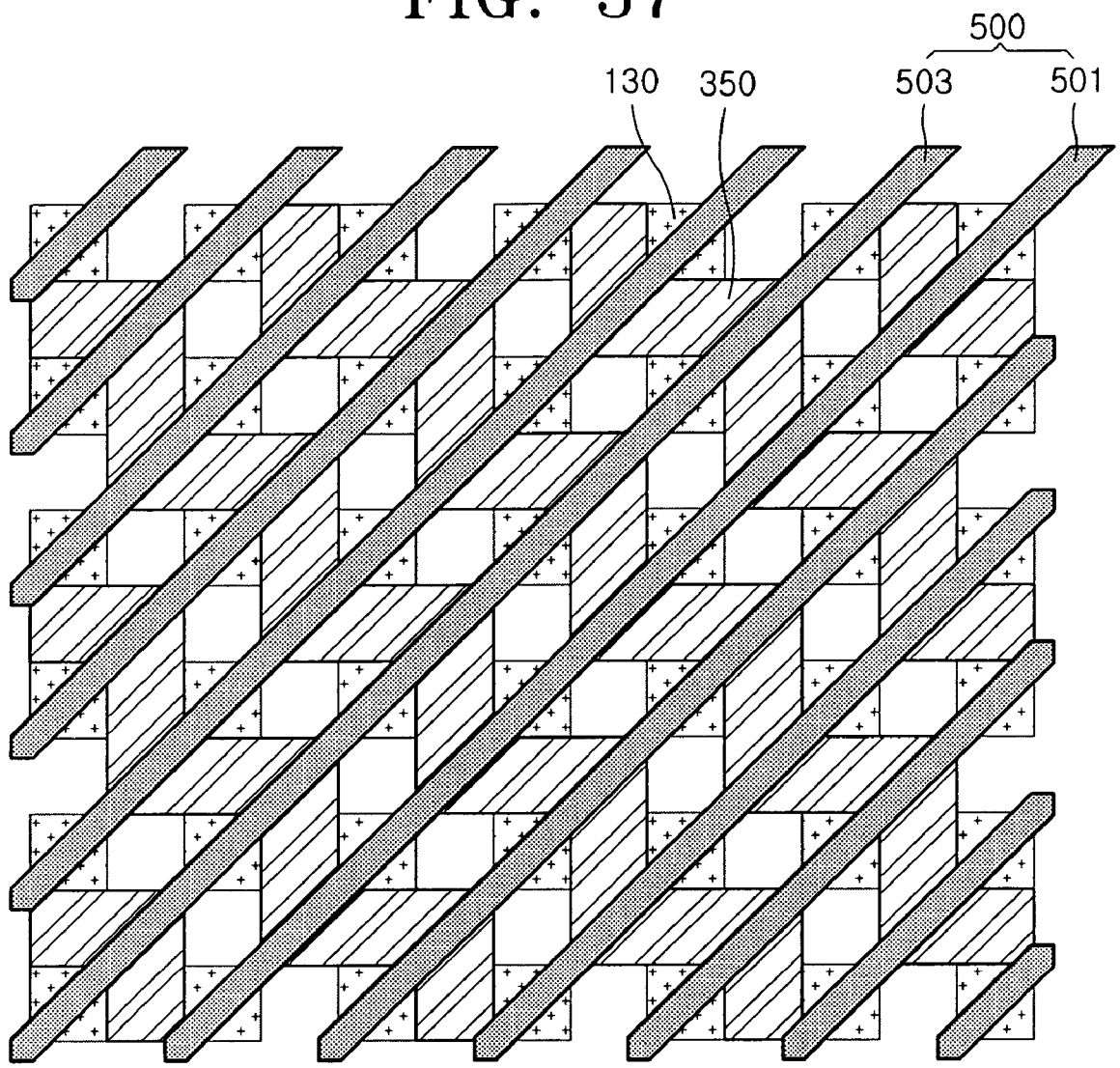

Referring to FIG. 37, after an insulating layer covering the gate 35 is formed as FIG. 17, a contact hole penetrating the insulating layer and exposing the source/drain regions 130 is formed. At this time, a connecting contact being connected to the bit line filling the contact hole is formed to include a conductive layer. Since the connecting contact is formed by an SAC formation process, a process margin may be further ensured.

Then, bit lines 500 such as BL1 501, BL2 502 being connected to the connecting contact as shown in FIG. 24 are formed in the same ways as described in connection with FIG. 7. Since two bit lines 501, 503 cross with one WL, that is, gate 350, the memory cell performs 2-bit operation.

Figure 38:
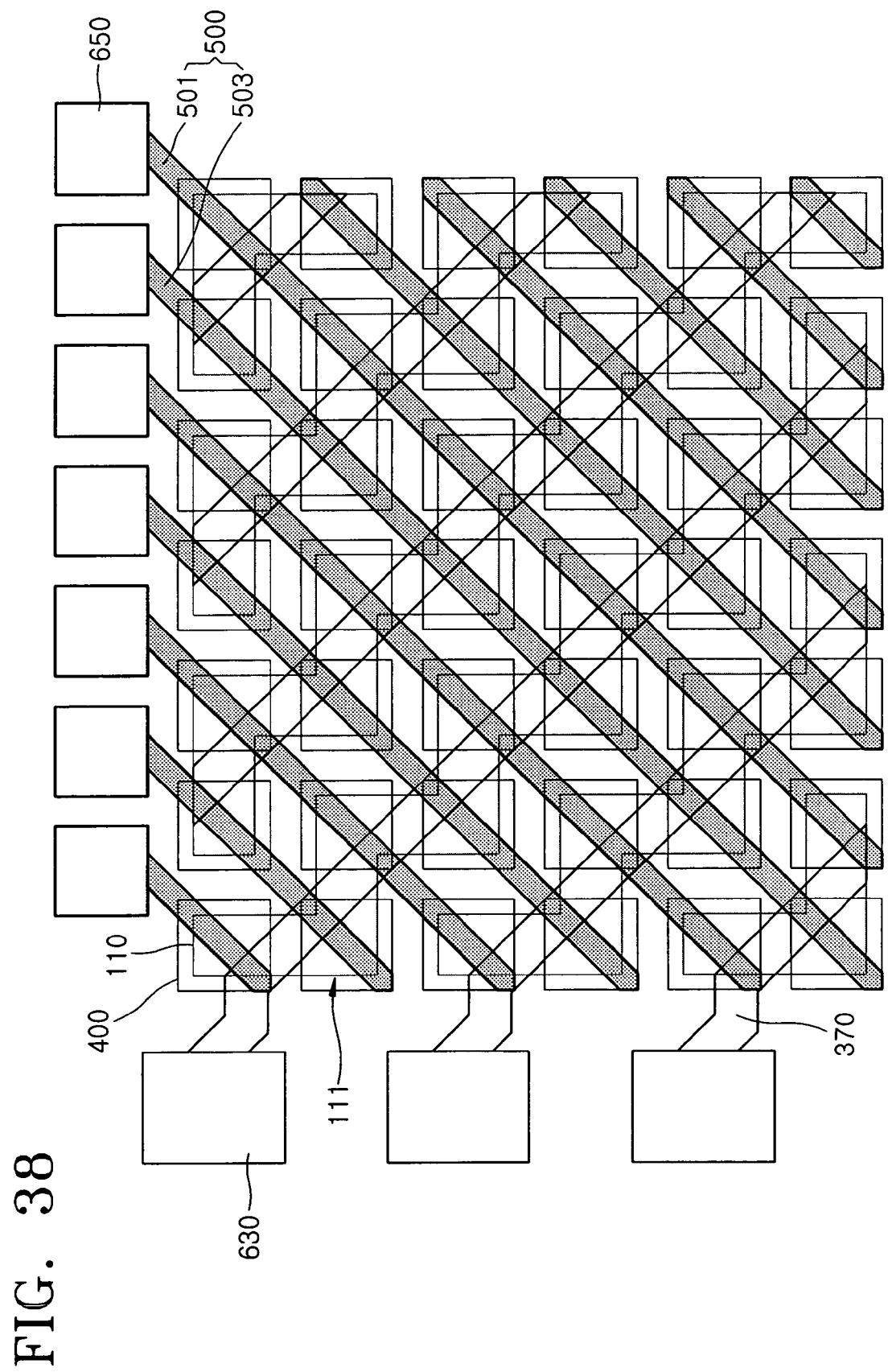
FIGS. 38 and 39 are plan views schematically illustrating a cell array of a non-volatile memory device for 2-bit operation according to a fourth embodiment of the present invention.
Figure 39:
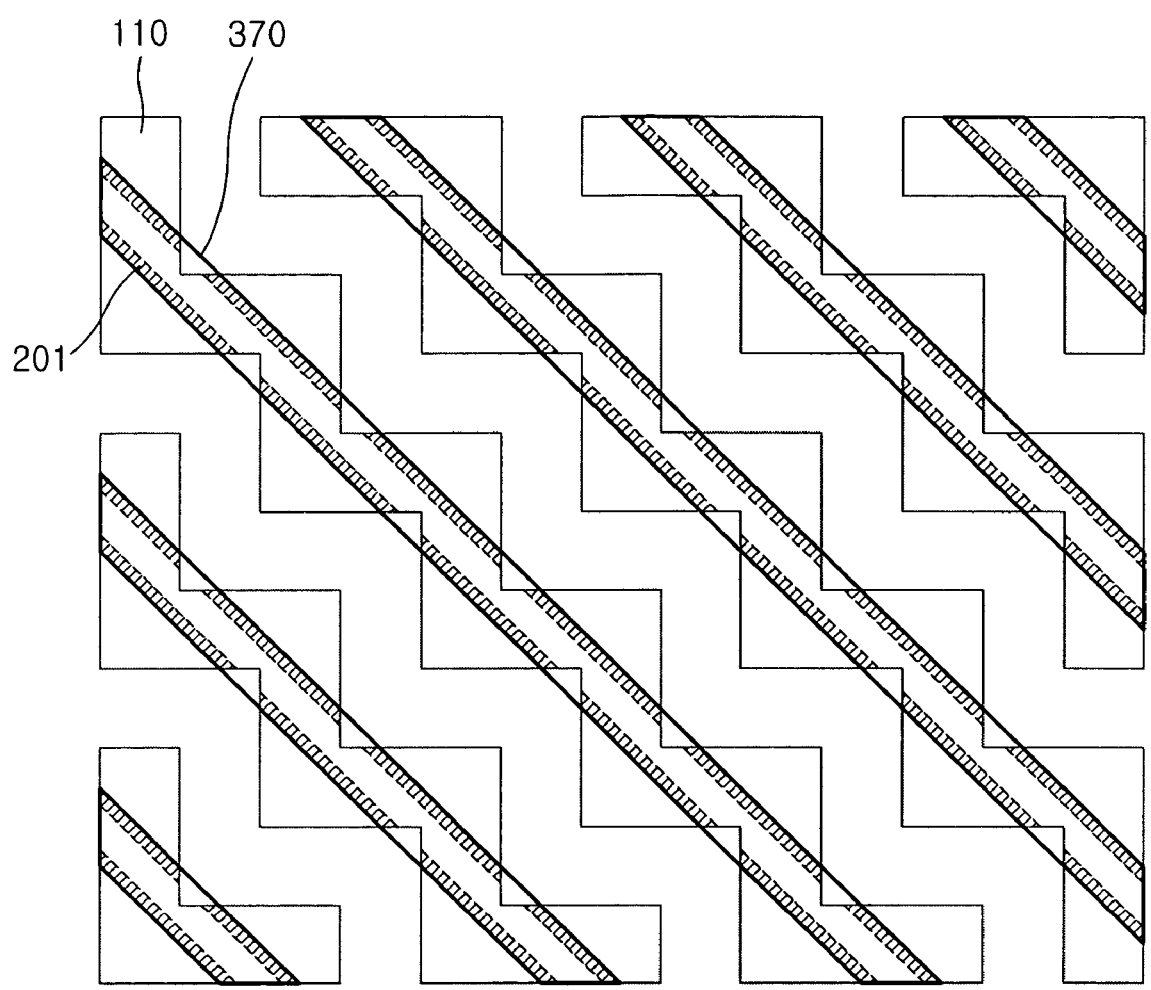

FIGS. 38 and 39 are plan views schematically illustrating a cell array of a non-volatile memory device for 2-bit operation according to a fourth embodiment of the present invention.

In the fourth embodiment unlike the first embodiment, a WL 300 (FIG. 2) may be formed in a straight pattern, not patterned in a second zigzag pattern. The processes of forming the transistor constituting memory cells in the fourth embodiment of the present invention may be performed in the same ways as described in connection with the second and third embodiments.

Referring to FIGS. 38 and 39, an active region 110 may be formed in a zigzag pattern, and may extend to a WL direction. Further, a word line 370 may be formed in a straight pattern to partially overlap the active region 110 such that a portion of the active region 110, for example, a bending portion 111 of the zigzag pattern of the active region 110 is exposed. The bit line 500 including a first bit line 501 and a second bit line 503 is formed to cross with the word line 370, and the BL 500 may be aligned with the WL 300 in a matrix shape.

A connecting contact 400 may be formed in an SAC process as shown in FIG. 7 and as described in connection with the second and third embodiments.

In FIGS. 38 and 39, a charge storage layer 201 of two transistors connected to one connecting contact 400 connected to one bit line 500 is shown to extend through two transistors, but in the case that the charge storage layer 201 is to capture charges, fix, and store the charges like an ONO, the two transistors can operate independently.

In this case, as described in connection with FIG. 5, the charge storage layer 201 may be locally formed inside the active region 110 physically separated from each other, by the same process as described in connection with the second and third embodiments. Thus, since charges are confined only inside the active region 110, charge spreading between cells and a mutual interference phenomenon due to the charge spreading can be effectively suppressed or prevented.

Further, two neighboring transistors can be maintained separated in the middle by changes of a line width or pitch of the active region 110 of the charge storage layer 201, a distance between the bending portions 111, a line width of the word line 370, and the like.

Figure 40:
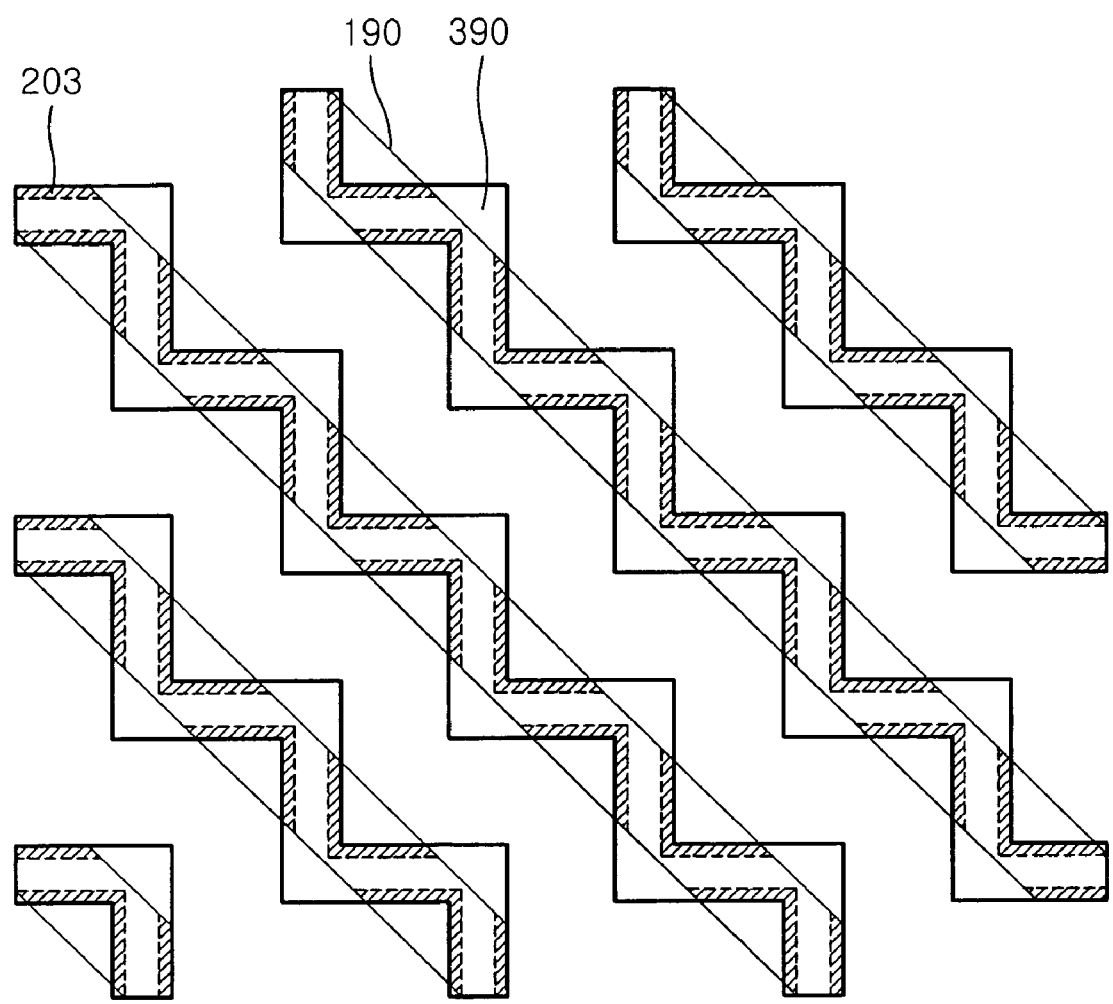
FIGS. 40 through 42 are plan views schematically illustrating a cell array of a non-volatile memory device for 2-bit operation according to a fifth embodiment of the present invention.
Figure 41:
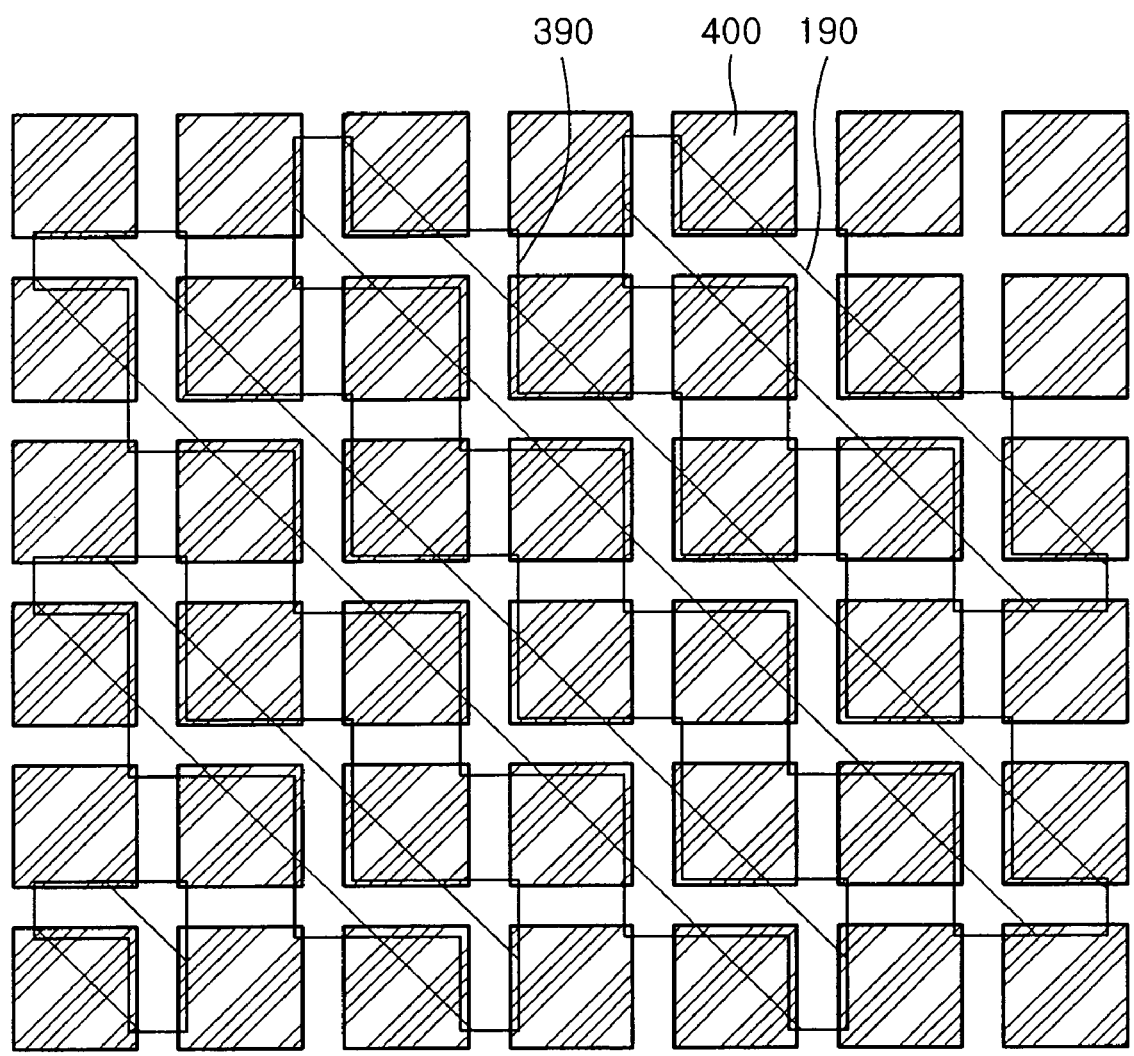
Figure 42:
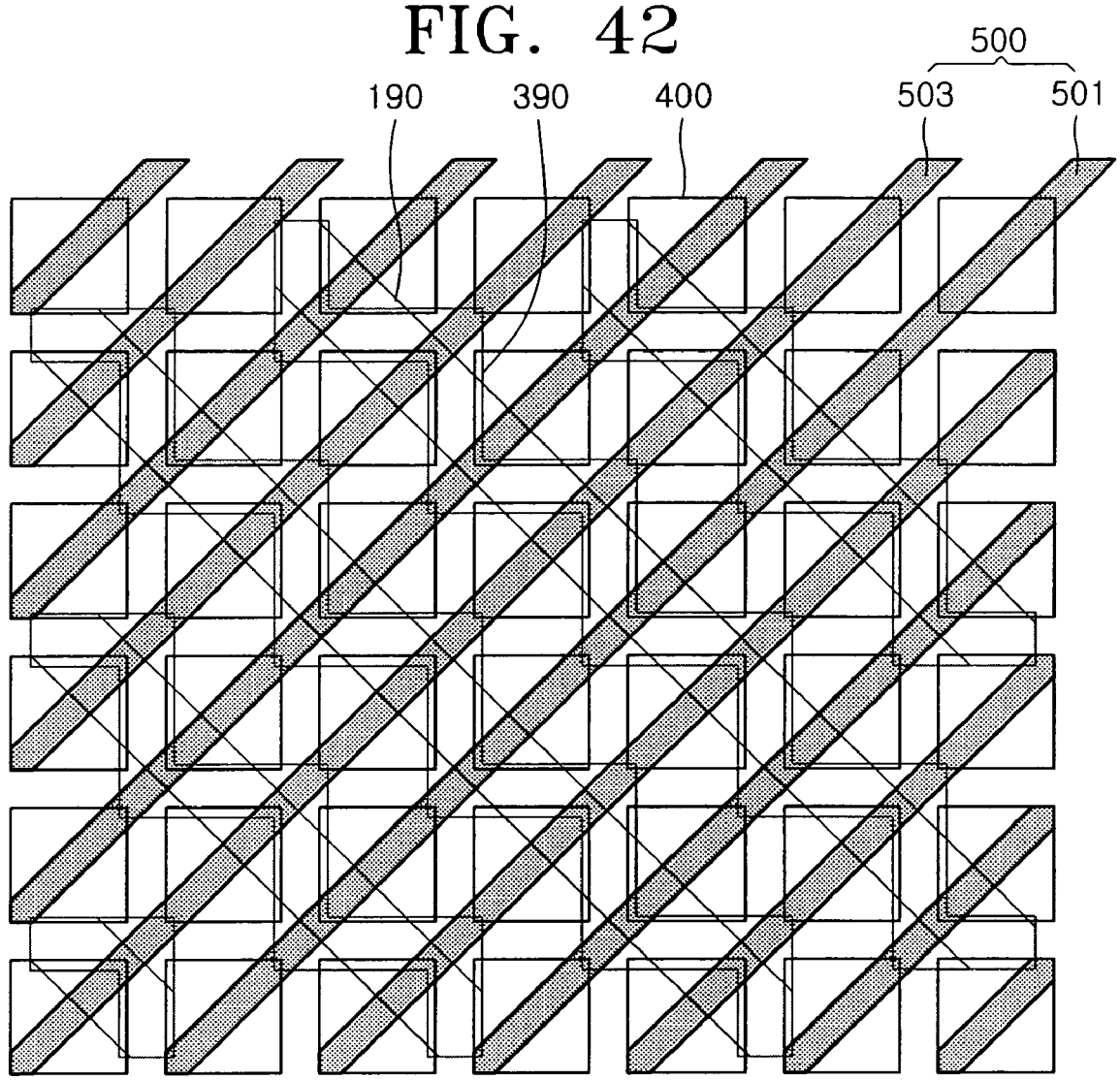

FIGS. 40 through 42 are plan views schematically illustrating a cell array of a non-volatile memory device for 2-bit operation according to a fifth embodiment of the present invention.

In the fifth embodiment of the present invention, unlike the first and fourth embodiments, the WL 300 (FIG. 2) is patterned in a second zigzag pattern, and the active region may be formed in a relatively long straight pattern. The processes of forming the memory cell in the fifth embodiment of the present invention may be performed in the same ways as described in connection with the second and third embodiments.

Referring to FIGS. 40 through 42, an active region 190 may be formed in a straight pattern, and may extend in a WL direction. Further, a word line 390 may be formed in a zigzag pattern partially overlapping the active region 190 such that a portion of the active region 190 repeatedly crosses or a portion of the active region 190 is repeatedly exposed. The zigzag pattern of the WL 390 may be patterned substantially in the same shape as the second zigzag pattern shown in FIG. 2. A bit line 500 including a first bit line and a second bit line may be formed to cross with the word line 390, and the BL 500 may be aligned in a matrix shape with the WL 390 as shown in FIG. 42.

Referring to FIG. 41, a connecting contact 400 may be formed on the active region 190 exposed to the WL 390, and may be formed as an SAC as shown in FIG. 7 or like the second and third embodiments.

Referring to FIGS. 40 and 42, a charge storage layer 203 (FIG. 40) of two transistors connected to one connecting contact 400 connected to one bit line 500 is formed to extend through two transistors, but in the case that the charge storage layer 203 is to capture, fix, and store charges like an ONO, two transistors may operate independently.

In this case, the charge storage layer 203 may be formed inside the active region 190 separated from each other as shown in FIG. 5 and as described in connection with the second and third embodiments. Thus, since charges are confined only inside the active region 190, charge spreading between cells and a mutual interference phenomenon due to the charge spreading can be effectively suppressed or prevented.

Further, two neighboring transistors can be maintained separated in the middle by changes of a line width or pitch of the active region 190 of the charge storage layer 203, a distance between the bending portions, and the like.

Figure 43:
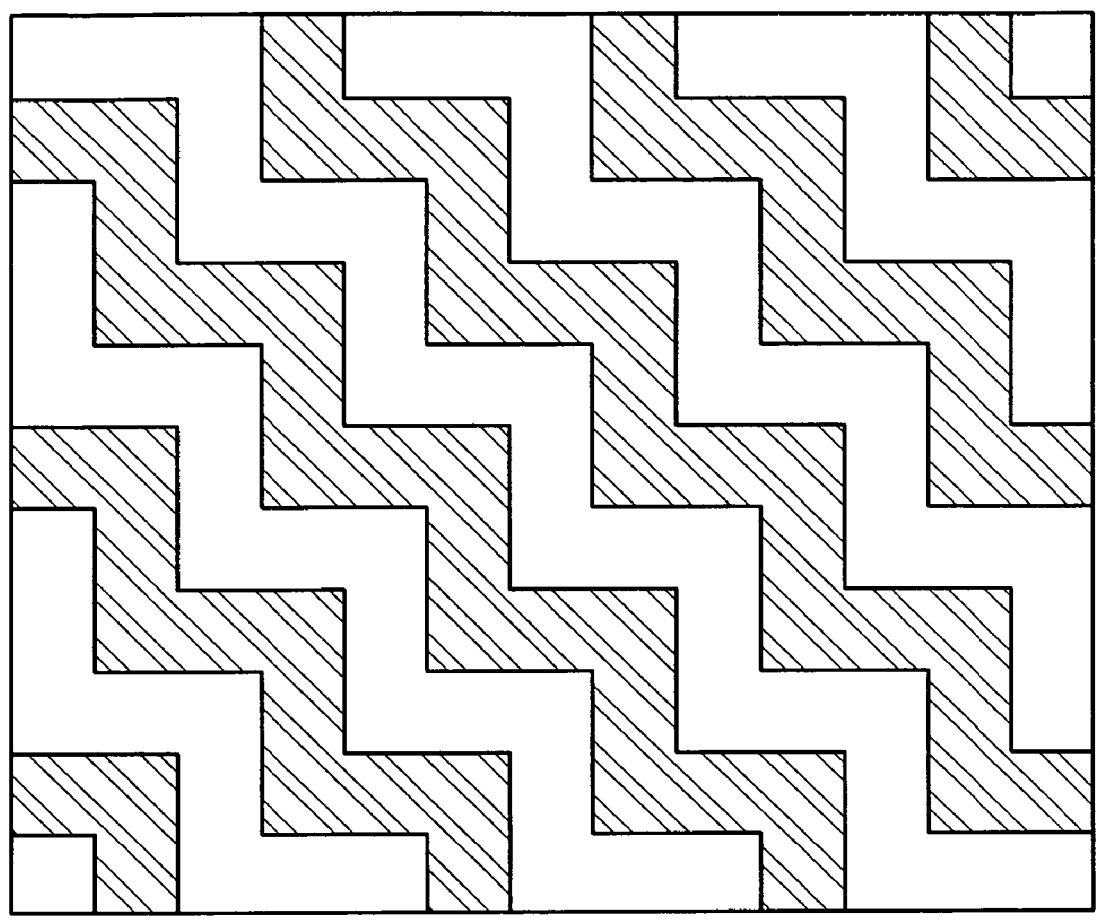
FIGS. 43 through 45 are views schematically illustrating a photolithography process for realizing a zigzag pattern according to an embodiment of the present invention.
Figure 44:
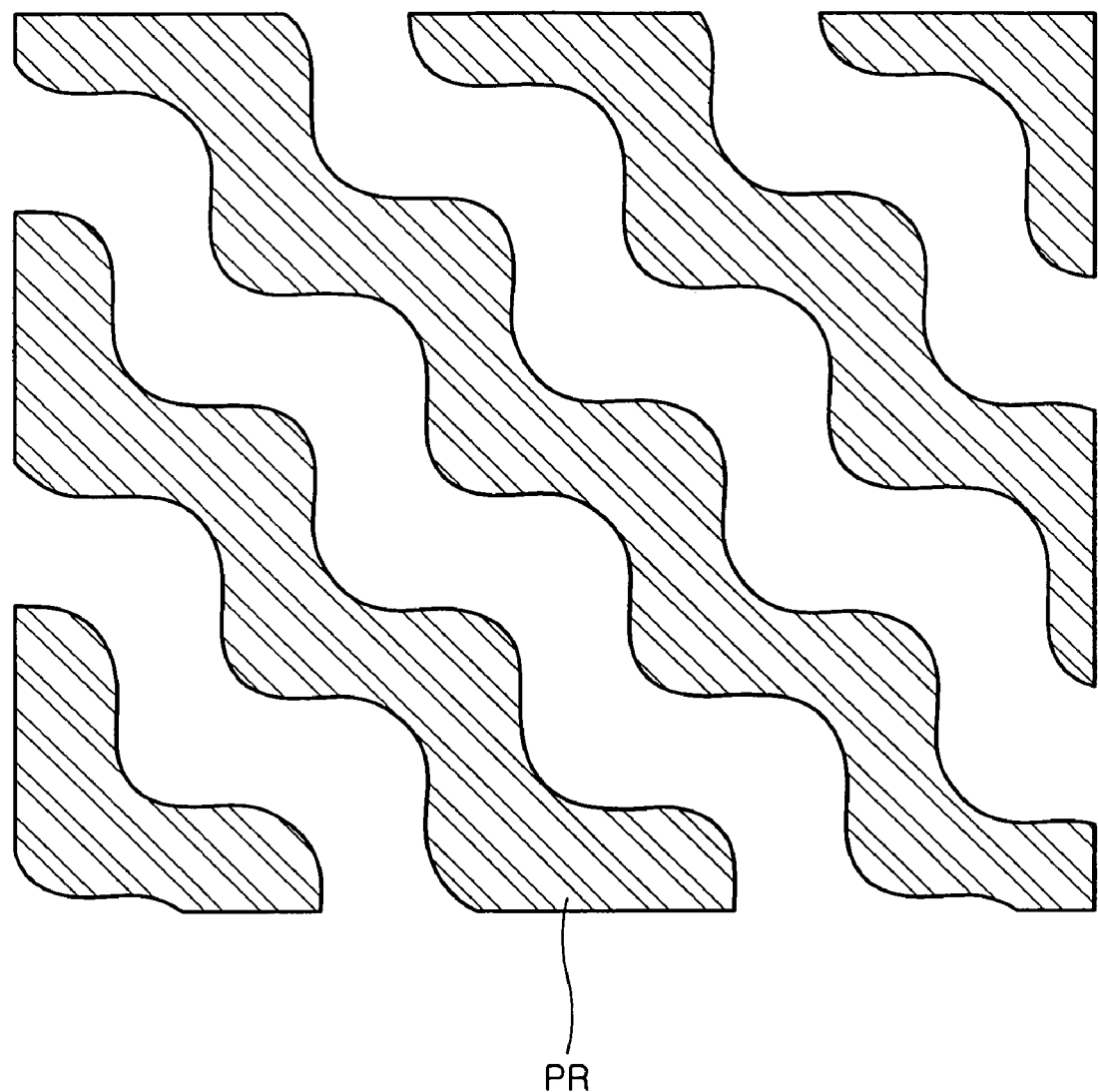
Figure 45:
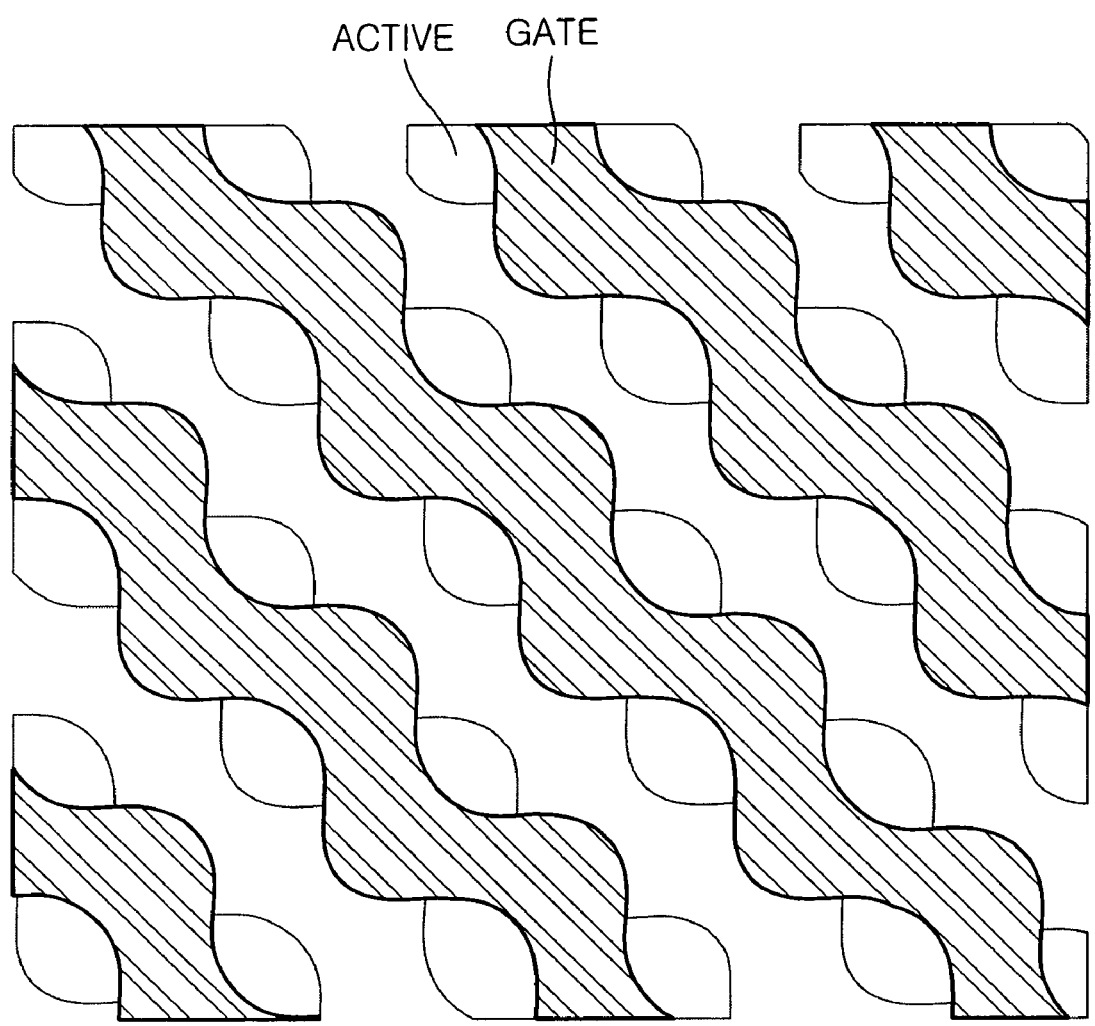

FIGS. 43 through 45 are views illustrating a simulation result to describe a photolithography process for realizing a zigzag pattern according to an embodiment of the present invention.

Referring to FIG. 43, the zigzag pattern for an active region or the zigzag pattern for a word line shown in the embodiments of the present invention may be realized to a real pattern by a photolithography process using a mask pattern designed as shown in FIG. 43.

When the photolithography process performed using a mask pattern designed as shown in FIG. 43 is examined through simulation, it is verified that the photoresist pattern of the zigzag pattern shown in FIG. 44 is realized. FIG. 45 shows results to verify that the active region and the gate are realized as zigzag patterns through simulation, and shows that the active region and the gate can be realized as zigzag patterns.

The simulation results of FIGS. 44 and 45 were designed with a line width of 100 nm, an ArF light source for exposure, the number of aperture (NA) of 0.85, and lens condition of 0.92-0.72 σ. An intensity of the light source during exposure is 55 mJ/cm$^2$.

The simulation results verify that the active region and/or the word line can be realized in a zigzag pattern according to embodiments of the present invention.

The processes described in the description of the embodiments of the present invention exemplify methods of realizing structures for 2-bit operation with physical separation. In the case of realizing a transistor employing one storage node, which is not separated, some of the processes are appropriately eliminated so as to realize non-separated one storage node. In this case, a charge storage layer providing a storage node is composed of a material for storing electrons by capturing and fixing electrons, for example, ONO, so as to provide 2-bit operation.

Further, the transistors formed according to embodiments of the present invention may be structured in circuits as a flash memory device of NAND type or NOR type.

According to the present invention as described above, a transistor constituting a non-volatile memory device cell can induce a charge storage layer or a storage node for storing charges to be confined inside an active region. Since the charge storage layer is restricted not to extend to an isolation region defining the active region, crosstalk between cells is prevented, and generation of charge spreading and mutual interference phenomenon between cells is prevented.

Thus, integration of the non-volatile memory device can be further increased since the integration limitation of the device due to the mutual interference phenomenon of the charges between cells is overcome.

Further, since a cell transistor having a storage node with a physically separated shape below one word line can be realized, a mutual interference phenomenon between bits inside the cell can be suppressed. Thus, an advantage of the non-volatile memory device for 2-bit operation can be realized.

Since a cell array is formed in a shape where a word line and a bit line cross, the word line and the bit line are aligned in a matrix shape. Thus, pads connected to the word line and/or the bit line are aligned with divided in word lines only or in bit lines only. Thus, the alignment of pads in a core region and a peripheral region around a cell can be further simplified, thereby solving complicated problems in the core region and the peripheral region.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device for 2-bit operation comprising:
    an active region and a gate extending in a word line direction on a semiconductor substrate, and crossing each other repeatedly;
    a charge storage layer disposed below the gate, and confined at a portion where the gate and the active region cross;
    a charge blocking layer formed at an interface between the charge storage layer and the gate;
    a tunnel dielectric layer formed at an interface between the charge storage layer and the active region;
    first and second source/drain regions formed at an exposed portion out of both sides of the gate in the active region; and
    first and second bit lines connected to the first and second source/drain regions respectively, and formed to extend in a bit line direction crossing the word line direction,
    wherein the active region is formed in a first zigzag pattern to extend in the word line direction in the semiconductor substrate and partially be bent repeatedly, and
    the gate is formed in a second zigzag pattern to extend in the word line direction on the semiconductor substrate, partially cross with the active region repeatedly, and repeatedly to be bent in symmetry with the first zigzag pattern.

2. A non-volatile memory device for 2-bit operation comprising:
    active regions formed in a first zigzag pattern to extend in a word line direction in a semiconductor substrate, and partially to be bent repeatedly;
    gates formed in a second zigzag pattern to extend in a word line direction in the semiconductor substrate, partially to cross with the active regions, and to be bent repeatedly in symmetry with the first zigzag pattern;
    a charge storage layer disposed below the gate, and confined at a portion where the gate and the active regions cross;
    a charge blocking layer formed at an interface between the charge storage layer and the gate;

a tunnel dielectric layer formed at an interface between the charge storage layer and the active regions;

first and second source/drain regions formed at an exposed portion out of both sides of the gate in the active regions; and first and second bit lines connected to the first and second source/drain regions respectively, and formed to extend in a bit line direction crossing the word line direction.

3. The non-volatile memory device according to claim 2, wherein the charge storage layer is formed as a pair separated below the gate adjacent to the first and second source/drain regions adjacent to both sides of the gate, the gate extends to an active portion between separated two charge storage layers, and the non-volatile memory device further comprises a gate dielectric layer formed at an interface between the gate portion extending between the two charge storage layers and the active portion.

4. The non-volatile memory device according to claim 3, wherein the charge blocking layer extends to an interface between the gate portion extending between the two charge storage layers to cover sidewalls of the charge storage layer and form the gate dielectric layer and the active portion.

5. The non-volatile memory device according to claim 2, wherein the charge storage layer is formed as a pair separated below the gate adjacent to the first and second source/drain regions adjacent to both sides of the gate, and the non-volatile memory device further comprises:

a first gate formed on an active portion between separated two charge storage layers;

second gates aligned to the charge storage layers on the two charge storage layers respectively, and attached to sides of the first gate; and a gate dielectric layer formed at an interface between the first gate portion and the active portion.

6. The non-volatile memory device according to claim 5, wherein the gate dielectric layer covers sides of the two charge storage layers and extends to an interface between the first gate and the second gate.

7. The non-volatile memory device according to claim 2, wherein the charge storage layer includes a silicon nitride layer, a polysilicon layer, a layer of silicon dots, a silicon germanium layer, or nano crystal for charge storages.

8. The non-volatile memory device according to claim 2, further comprising: an insulating spacer attached to sides of the gate; and a connecting contact in an SAC shape connecting the first and second bit lines and the first and second source/drain regions respectively.

9. The non-volatile memory device according to claim 2, further comprising:

first pads connected to ends of the gates, and electrically connecting the word lines aligned together to outside; and second pads aligned separated from the alignment of the first pads, and electrically connecting the bit lines to outside.

\* \* \* \* \*